US011056370B2

(12) United States Patent
Ogawa et al.

(10) Patent No.: US 11,056,370 B2
(45) Date of Patent: Jul. 6, 2021

(54) METHOD FOR PROCESSING WORKPIECE

(71) Applicant: TOKYO ELECTRON LIMITED, Tokyo (JP)

(72) Inventors: Shuhei Ogawa, Miyagi (JP); Keigo Toyoda, Miyagi (JP); Yoshihide Kihara, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/322,863

(22) PCT Filed: Aug. 1, 2017

(86) PCT No.: PCT/JP2017/027888
§ 371 (c)(1),
(2) Date: Feb. 1, 2019

(87) PCT Pub. No.: WO2018/025855
PCT Pub. Date: Feb. 8, 2018

(65) Prior Publication Data
US 2019/0189493 A1    Jun. 20, 2019

(30) Foreign Application Priority Data

Aug. 5, 2016 (JP) .............................. JP2016-154663

(51) Int. Cl.
*H01L 21/683* (2006.01)
*H01L 21/3065* (2006.01)
(Continued)

(52) U.S. Cl.
CPC .... *H01L 21/6833* (2013.01); *H01J 37/32715* (2013.01); *H01L 21/0273* (2013.01);
(Continued)

(58) Field of Classification Search
CPC ........... H01L 21/6833; H01L 21/31122; H01L 21/67109; H01L 21/768; H01L 21/32137;
(Continued)

(56) References Cited

U.S. PATENT DOCUMENTS 8,105,949 B2 * 1/2012 Honda ................. H01L 21/311
438/695
2017/0221682 A1 * 8/2017 Nishimura .............. H01L 21/28

FOREIGN PATENT DOCUMENTS

JP      S61-097888 A    5/1986
JP      2000-216447 A   8/2000
(Continued)

OTHER PUBLICATIONS

International Search Report issued in PCT/JP2017/027888; dated Oct. 31, 2017.

*Primary Examiner* — Nadine G Norton
*Assistant Examiner* — Mahmoud Dahimene
(74) *Attorney, Agent, or Firm* — Studebaker & Brackett PC

(57) ABSTRACT

A method according to an embodiment includes: (a) a first step of etching a workpiece held by a holding structure in a state in which a first direction and a second direction are maintained to form a first angle, by a plasma generated in a processing container; and (a) a second step of, after execution of the first step, etching the workpiece held by the holding structure in a state in which the first direction and the second direction are maintained to form a second angle, by the plasma generated in the processing container.

3 Claims, 14 Drawing Sheets

(51) Int. Cl.
　　　*H01L 21/308*　　　(2006.01)
　　　*H01L 21/311*　　　(2006.01)
　　　*H01L 21/67*　　　(2006.01)
　　　*H01L 21/027*　　　(2006.01)
　　　*H01L 21/687*　　　(2006.01)
　　　*H01L 21/3213*　　　(2006.01)
　　　*H01L 21/768*　　　(2006.01)
　　　*H01J 37/32*　　　(2006.01)
　　　*H01L 27/11582*　　　(2017.01)
　　　*H01L 27/11556*　　　(2017.01)

(52) U.S. Cl.
　　　CPC ........ *H01L 21/308* (2013.01); *H01L 21/3065* (2013.01); *H01L 21/31116* (2013.01); *H01L 21/31122* (2013.01); *H01L 21/31138* (2013.01); *H01L 21/31144* (2013.01); *H01L 21/32137* (2013.01); *H01L 21/67069* (2013.01); *H01L 21/67109* (2013.01); *H01L 21/6831* (2013.01); *H01L 21/68792* (2013.01); *H01L 21/768* (2013.01); *H01J 2237/20214* (2013.01); *H01J 2237/3341* (2013.01); *H01L 27/11556* (2013.01); *H01L 27/11582* (2013.01)

(58) Field of Classification Search
　　　CPC .......... H01L 21/6831; H01L 21/68792; H01L 21/31138; H01L 21/31144; H01L 21/0273; H01L 21/67069; H01L 21/31116; H01L 21/308; H01L 21/3065; H01L 27/11556; H01L 27/11582; H01L 21/32136; H01J 37/32715; H01J 2237/3341; H01J 2237/20214; H05H 1/46
　　　See application file for complete search history.

(56)　　　　　　References Cited

FOREIGN PATENT DOCUMENTS

| | | | |
|---|---|---|---|
| JP | 2004-080033 A | 3/2004 | |
| JP | 2016-082020 A | 5/2016 | |
| WO | WO-2016060063 A1 * | 4/2016 | ............ H01L 21/28 |
| WO | 2017/082373 A1 | 5/2017 | |

* cited by examiner

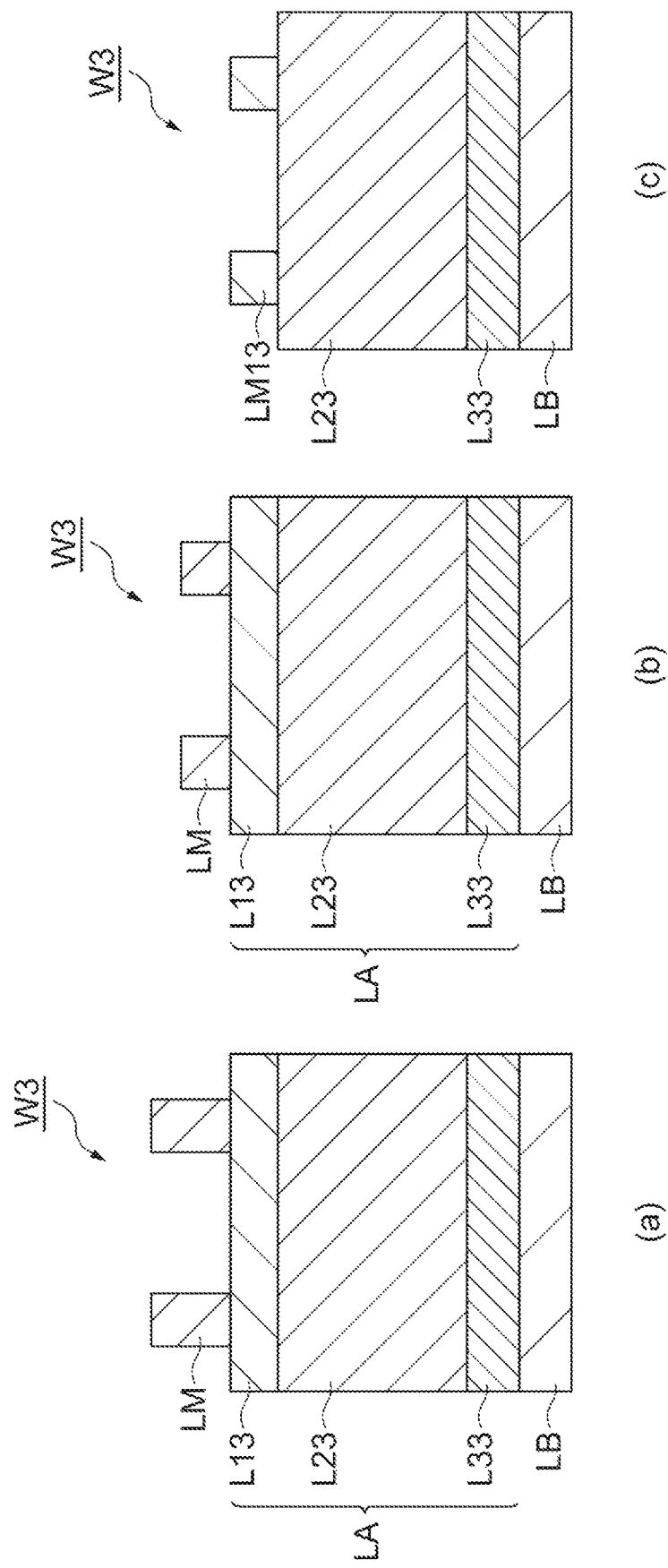

METHOD FOR PROCESSING WORKPIECE

TECHNICAL FIELD

An embodiment of the present invention relates to a method for processing a workpiece.

BACKGROUND ART

In a manufacturing process of an electronic device such as a semiconductor device, a mask is formed on a processing target layer, and etching is performed to transfer the pattern of the mask to the processing target layer. As the mask, a resist mask is generally used. The resist mask is formed by a photolithography technique. Therefore, the critical dimension of the pattern formed in a etching target layer is influenced by the resolution limit, pattern density, and the like of the resist mask formed by the photolithography technique. However, in recent years, with higher integration of electronic devices, it is required to form a pattern having a size smaller than the resolution limit of the resist mask. Therefore, as described in Patent Literature 1, a technique of forming a silicon oxide film on a resist mask to control the dimensions of the resist mask and thus reducing the width of an opening provided by the resist mask has been proposed.

In a micropattern forming method disclosed in Patent Literature 1, a photoresist pattern is formed on a material film on which a micropattern is to be formed, and a silicon oxide film is deposited thereon but has to be thinly and conformally formed without damaging the lower photoresist pattern thereunder. Thereafter, dry etching is performed on the lower film. Initially, a spacer is formed on the side wall of the photoresist pattern, and then a polymer film is formed on the photoresist pattern.

CITATION LIST

Patent Literature

[Patent Literature 1] Japanese Patent Laid-Open Publication No. 2004-80033

SUMMARY OF INVENTION

Technical Problem

Meanwhile, there may be cases where miniaturization caused by high integration of electronic devices in recent years requires highly accurate control over the critical dimension (CD) and pattern shape in pattern formation on a workpiece. However, this is accompanied by the complexity of processes as in the method of Patent Literature 1. In particular, a technique is desired for etching a layer of material dominated by ionic etching and a layer of material dominated by radical etching with a relatively high selectivity without causing the complexity of processes.

Solution to Problem

In an aspect, a method of etching a workpiece using a plasma processing apparatus is provided. The plasma processing apparatus includes a holding structure which holds the workpiece, and a processing container which accommodates the holding structure. The holding structure is rotatable by 360 degrees in the processing container around an inclination shaft provided in the processing container. The inclination shaft intersects the holding structure. An axis of the inclination shaft is parallel to a surface of an electrode plate of an upper electrode provided on a ceiling side of the processing container and a surface of the workpiece held by the holding structure. In a state in which the surface of the workpiece held by the holding structure and the surface of the electrode plate are parallel to each other and face each other, a first center axis of the workpiece and a second center axis of the processing container overlap with each other and a first direction of the first center axis and a second direction of the second center axis are the same. The first center axis is perpendicular to the surface of the workpiece. The first direction is directed upward of the surface of the workpiece. The second center axis is perpendicular to the surface of the electrode plate. The second direction is directed toward the electrode plate provided on the ceiling side of the processing container from a bottom portion side of the processing container. The first center axis is inclined with respect to the second center axis as the holding structure rotates around the inclination shaft. The method includes: (a) a first step of generating a plasma in the processing container in which the workpiece is held by the holding structure, in a state in which the first direction and the second direction are maintained to form a first angle; and (b) a second step of, after execution of the first step, generating a plasma in the processing container in which the workpiece is held by the holding structure, in a state in which the first direction and the second direction are maintained to form a second angle. The first angle and the second angle are −180 degrees to +180 degrees, and an absolute value of the first angle and an absolute value of the second angle are different from each other.

In the method, in the first step and the second step, since the direction of the holding structure that holds the workpiece varies, in each step, the difference in ion density due to the plasma generated in the processing container can be easily utilized without causing the complexity of processes. In particular, by changing the direction of the holding structure in the processing container without changing the gas state, the plasma state, and the like, the difference in ion density can be easily utilized.

In the embodiment, the workpiece may include a laminated region and a mask provided on the laminated region, the laminated region may include a plurality of first layers and a plurality of second layers, the first layers and the second layers may be alternately laminated along a lamination direction, the first layer may be a layer dominated by isotropic etching compared to the second layer, the absolute value of the first angle may be smaller than the absolute value of the second angle, in the first step, the laminated region may be etched in the lamination direction using the mask, and by the etching, a groove may be formed in the laminated region, and in the second step, the first layer exposed to an inside of the groove may be etched. As described above, in the first step and the second step, since the direction of the holding structure that holds the workpiece varies, the difference in ion density in the processing container can be utilized. Therefore, by changing the direction of the holding structure, it is possible to easily switch between etching of the layer dominated by isotropic etching and etching of the layer dominated by anisotropic etching.

In the embodiment, the workpiece includes an antireflection film and a mask provided on the antireflection film, the absolute value of the first angle is larger than the absolute value of the second angle, the mask is a layer dominated by isotropic etching, in the first step, a surface of the mask is modified, and in the second step, the antireflection film is etched using the mask. As described above, in the first step of modifying the surface of the mask dominated by isotropic etching, the absolute value of the first angle is larger than the absolute value of the second angle. Therefore, the workpiece is avoided far away from the electrode plate, so that the ion density in the vicinity of the workpiece is decreased. Accordingly, deterioration of the shape of the mask due to the execution of the first step can be avoided.

In the embodiment, one angle with a smaller absolute value of the first angle and the second angle is in a range of −30 degrees to +30 degrees, and the other angle with a larger absolute value is in a range of −180 degrees to −150 degrees and +150 degrees to +180 degrees. The difference in ion density due to the plasma generated in the processing container can be sufficiently different between the case where the angle between the first direction and the second direction associated with the holding structure is in a range of −30 degrees to +30 degrees and the case where the angle is in a range of −180 degrees to −150 degrees and +150 degrees to +180 degrees.

Advantageous Effects of Invention

As described above, a technique for etching a layer of material dominated by ionic etching and a layer of material dominated by radical etching with a relatively high selectivity without causing the complexity of processes is provided.

BRIEF DESCRIPTION OF DRAWINGS

FIG. 14 includes parts (a) to (c), in which part (a) of FIG. 14 illustrates a sectional structure of a wafer before processing of the method shown in FIG. 13, and parts (b) and (c) of FIG. 14 illustrate sectional structures of the wafer after the processing of the method shown in FIG. 13.

DESCRIPTION OF EMBODIMENTS

Figure 1:
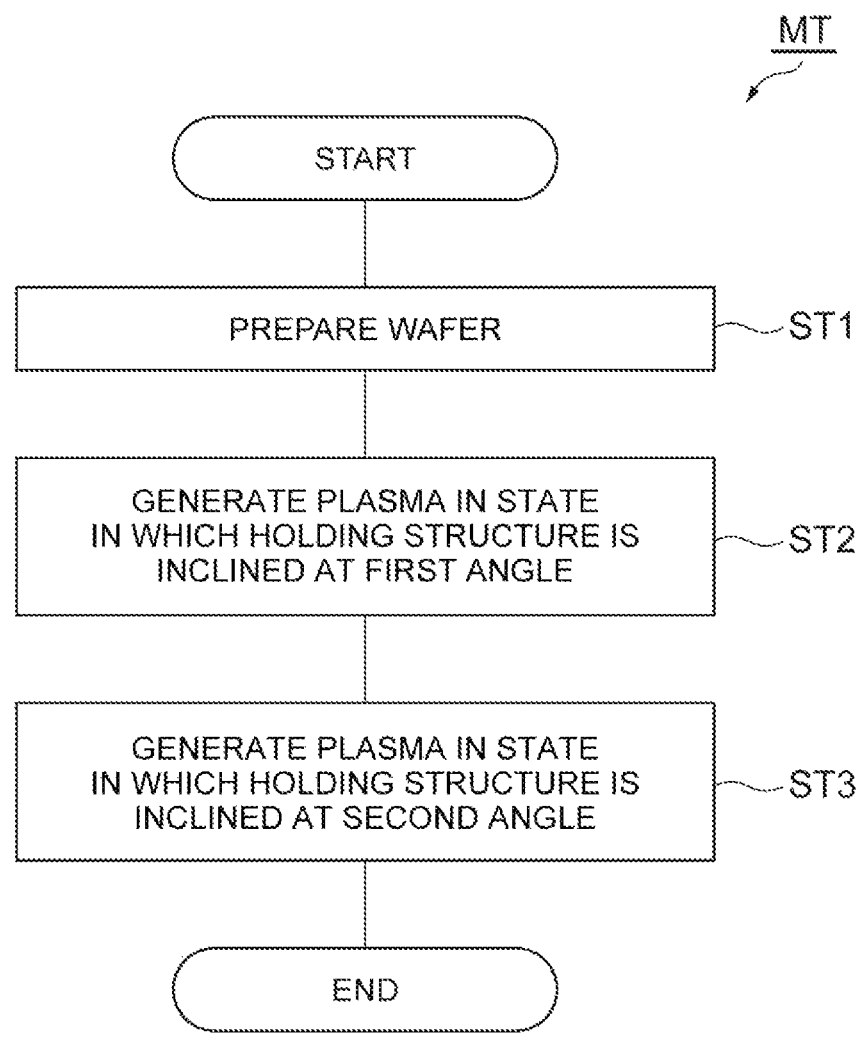
FIG. 1 is a flowchart showing a method for processing a workpiece according to an embodiment.

Hereinafter, various embodiments will be described in detail with reference to the drawings. In the drawings, like elements which are the same or similar are denoted by like reference numerals.

FIG. 1 is a flowchart showing a method of an embodiment. A method MT of the embodiment shown in FIG. 1 is a method for processing a workpiece (hereinafter, sometimes referred to as "wafer"). As shown in FIG. 1, the method MT includes steps ST1 to ST3.

Figure 2:
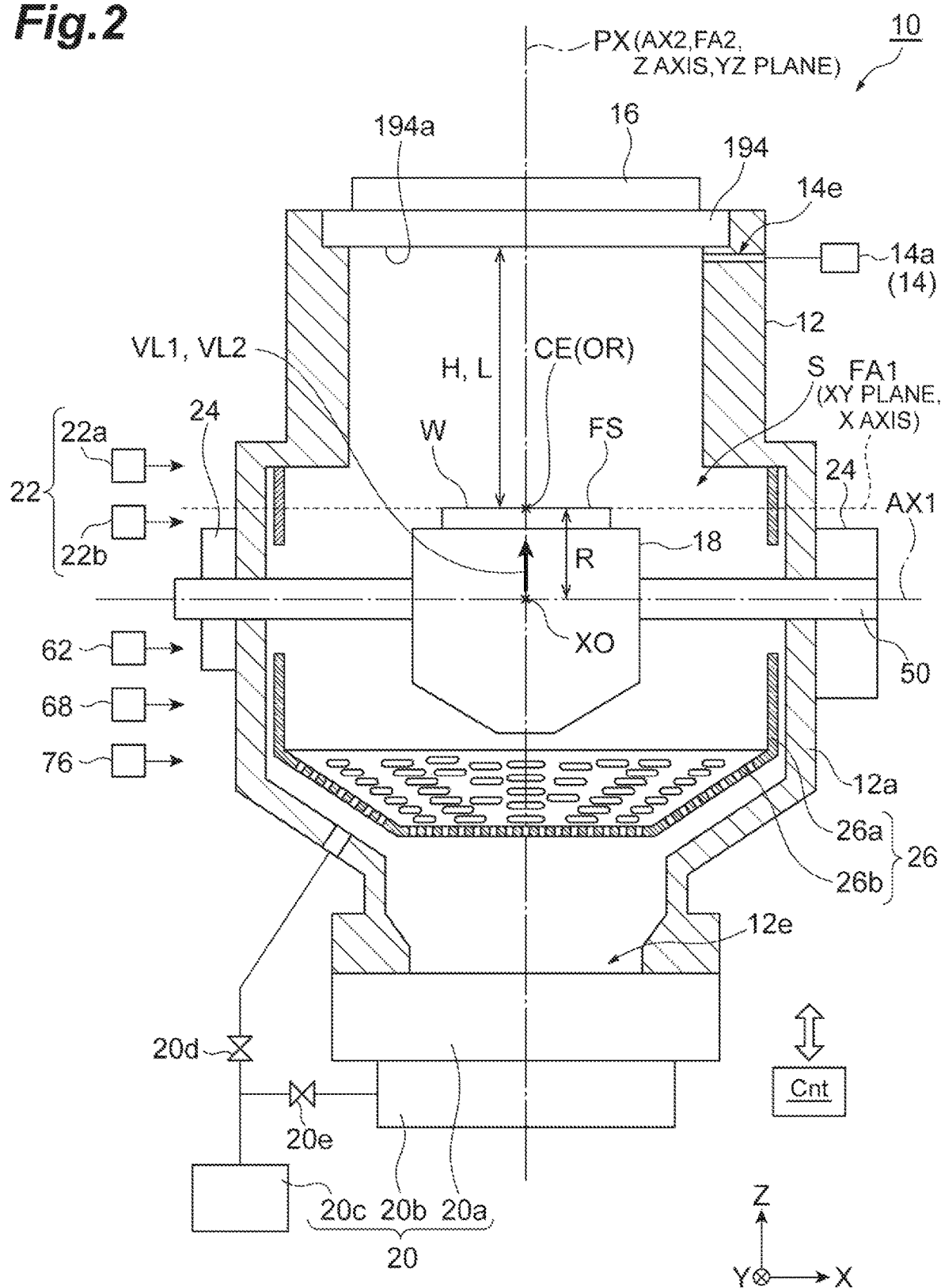
FIG. 2 is a view schematically illustrating a plasma processing apparatus according to the embodiment.
Figure 3:
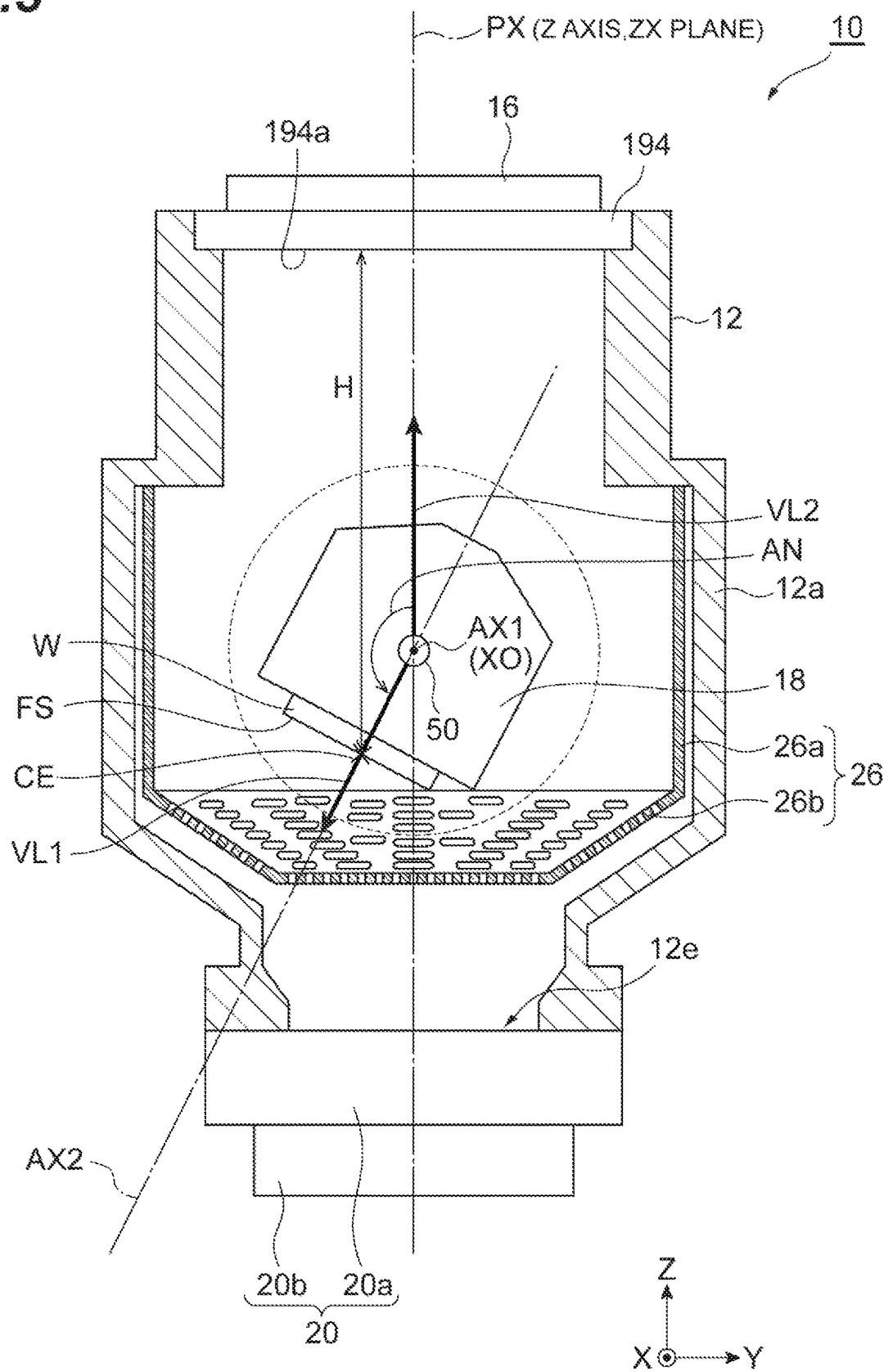
FIG. 3 is a view schematically illustrating the plasma processing apparatus according to the embodiment.

FIGS. 2 and 3 are views illustrating an example of a plasma processing apparatus (plasma processing apparatus 10). In FIG. 2, the plasma processing apparatus in a state in which a holding structure, which will be described later, is not inclined is illustrated, and FIG. 3, the plasma processing apparatus in a state in which the holding structure is inclined is illustrated. FIGS. 2 and 3 are views schematically illustrating the plasma processing apparatus according to the embodiment. More specifically, FIGS. 2 and 3 schematically illustrate a sectional structure of the plasma processing apparatus which can be used in various embodiments of the method for processing a workpiece, and illustrate the plasma processing apparatus by breaking a processing container in one plane including an axis PX (a second center axis of a processing container 12) extending in a vertical direction. As illustrated in FIGS. 2 and 3, the plasma processing apparatus 10 is a capacitively coupled plasma etching apparatus.

The plasma processing apparatus 10 illustrated in FIGS. 2 and 3 includes the processing container 12, a gas supply system 14, a plasma source 16 (upper electrode), a holding structure 18, an exhaust system 20, a bias power supply portion 22, and a control unit Cnt. The processing container 12 has a substantially cylindrical shape. The center axis line of the processing container 12 is coincident with the axis PX. The processing container 12 provides a space S for performing plasma processing on a wafer W.

The axis PX extends in a direction from the ceiling side of the processing container 12 where a dielectric plate 194 (electrode plate) and the like of the plasma source 16 (upper electrode) are provided, to the bottom portion side of the processing container 12 where the holding structure 18, an automatic pressure controller 20a, and the like are provided. FIGS. 2 and 3 show an XYZ orthogonal coordinate system for specifying a position inside the processing container 12 (specifying means finding, and the same will be applied hereinafter). The XYZ orthogonal coordinate system has an X axis, a Y axis, and a Z axis which are perpendicular to each other, and an origin OR where these three axes intersect. It can be said that FIG. 2 is a view of the inside of the plasma processing apparatus 10 as viewed in a Y direction, and FIG. 3 is a view of the inside of the plasma processing apparatus 10 as viewed in a direction opposite to an X direction. The axis PX is coincident with the Z axis, is on a YZ plane, and is orthogonal to an XY plane.

In the embodiment, the processing container 12 has a substantially constant width in an intermediate part 12a in a height direction of the processing container 12, that is, in a part that accommodates the holding structure 18. In addition, the processing container 12 has a tapered shape with a width gradually decreasing from the lower end of the intermediate part 12a to the bottom portion. The bottom portion of the processing container 12 provides an exhaust port 12e, and the exhaust port 12e is formed axisymmetrically with respect to the axis PX.

The gas supply system 14 is configured to supply a gas into the processing container 12. The gas supply system 14 has a gas supply portion 14a and a gas discharge hole 14e. Details of the gas supply system 14 will be described later.

The plasma source 16 is configured to excite the gas supplied into the processing container 12. In the embodiment, the plasma source 16 is provided at the top portion of the processing container 12. The center axis of the plasma source 16 is coincident with the axis PX. Details of an example of the plasma source 16 will be described later.

The holding structure 18 is configured to hold the wafer W in the processing container 12. The holding structure 18 is configured to be rotatable about a first axis AX1 orthogonal to the axis PX. The axis of the first axis line AX1 is parallel to a surface 194a of the dielectric plate 194 (electrode plate) of the plasma source 16 (upper electrode) provided on the ceiling side in the processing container 12, and a surface FS of the wafer W held by the holding structure 18. The first axis AX1 is coincident with the center axis of the inclination shaft portion 50 (inclination shaft). Further, the holding structure 18 is configured to rotate the wafer W about a second axis AX2 (the first center axis of the wafer W) orthogonal to the first axis AX1. The holding structure 18 can be inclined with respect to the axis PX by rotation about the first axis AX1. In the processing container 12, the holding structure 18 can rotate (revolve) by 360 degrees around the inclination shaft portion 50 provided in the processing container 12. In order to incline the holding structure 18, the plasma processing apparatus 10 has a driving device 24. The driving device 24 is provided outside the processing container 12 and generates a driving force for rotating the holding structure 18 about the first axis AX1. The wafer W corresponds to, for example, one of a wafer W1 illustrated in part (a) of FIG. 10, a wafer W2 illustrated in part (a) of FIG. 12, and a wafer W3 illustrated in part (a) of FIG. 14, which will be described later.

The first axis AX1 extends parallel a horizontal reference plane FA1, the XY plane, and the X axis, is orthogonal to the Y axis and the Z axis, and is orthogonal to a vertical reference plane FA2. The horizontal reference plane FA1 is orthogonal to the axis PX, includes the origin OR, is orthogonal to the Z axis, and overlaps with the XY plane. The horizontal reference plane FA1 includes the surface FS of the wafer W placed on a holding portion 30 of the holding structure 18. The vertical reference plane FA2 is coincident with the YZ plane, is orthogonal to the horizontal reference plane FA1, the XY plane, the X axis, and the first axis AX1, and includes the axis PX, the second axis AX2, and the origin OR. The first axis AX1 is orthogonal to the axis PX, the second axis AX2, and the vertical reference plane FA2 and is coincident with the center axis of the inclination shaft portion 50. The surface FS of the wafer W is orthogonal to the vertical reference plane FA2 and the second axis AX2 and extends parallel to the X axis and the first axis AX1. The second axis AX2 is perpendicular to the surface FS of the wafer W. The second axis AX2 is coincident with the center axis line of the wafer W. The second axis AX2 passes through a center CE of the surface FS of the wafer W. The axis PX and the first axis AX1 intersect each other at a point of intersection XO. In a case where the second axis AX2 is inclined with respect to the axis PX, the axis PX, the first axis AX1, and the second axis AX2 intersect each other at the point of intersection XO. The point of intersection XO lies on the first axis AX1 and lies on the vertical reference plane FA2, the YZ plane, and the ZX plane.

In a state in which the holding structure 18 is not inclined, as illustrated in FIG. 2, the second axis AX2 is coincident with the axis PX. In this state, the surface FS of the wafer W is orthogonal to the axis PX, overlaps with the horizontal reference plane FA1 and the XY surface, and includes the origin OR. The center CE of the surface FS is coincident with the origin OR and lies on each of the axis PX and the second axis AX2. The second axis AX2 overlaps with the axis PX and includes the origin OR. The distance from the center CE of the surface FS of the wafer W to a surface 194a of the dielectric plate 194 is L [mm], and the distance from the center CE to the point of intersection XO is R [mm]. In the embodiment, the origin OR is assumed to be coincident with the center CE of the surface FS of the wafer W as described above for convenience of description, but is not limited thereto.

In a state in which the holding structure 18 is not inclined, the surface FS of the wafer W held by the holding structure 18 and the surface 194a of the dielectric plate 194 are parallel and face each other, the center axis (the second axis AX2) of the wafer W and the center axis (the axis PX) of the processing container 12 overlap with each other, and a first direction VL1 of the second axis AX2 and a second direction VL2 of the axis PX are the same. The second axis AX2 is perpendicular to the surface FS of the wafer W. The first direction VL1 is directed upward of the surface FS of the wafer W. The axis PX is perpendicular to the surface 194a of the dielectric plate 194 on the ceiling side of the processing container 12. The second direction VL2 is directed toward the dielectric plate 194 provided on the ceiling side of the processing container 12 from the bottom portion side of the processing container 12.

On the other hand, as illustrated in FIG. 3, in a state in which the holding structure 18 is inclined, the second axis AX2 is inclined with respect to the axis PX. Regarding the second axis AX2, as the holding structure 18 rotates (revolves) around the first axis AX1, the holding structure 18 is inclined with respect to the second axis AX2. An inclination angle AN of the second axis AX2 is an angle between the second axis AX2 and the axis PX. The inclination angle AN is an angle in the YZ plane. The second axis AX2 and the axis PX lie on the YZ plane. As illustrated in FIG. 3, a value ϕ of the inclination angle AN of the second axis AX2 is determined to be a positive value in a case where the holding structure 18 rotates about the first axis AX1 and is thus inclined so as to cause the surface FS of the wafer W to face in a −Y direction. The value ϕ takes a negative value in a case where the holding structure 18 rotates about the first axis AX1 and is thus inclined so as to cause the surface FS of the wafer W to face in a +Y direction. That is, ϕ is in a range of −180 degrees to +180. The value ϕ of the inclination angle AN of the second axis AX2 is also a value of the angle between the first direction VL1 of the second axis AX2 and the second direction VL2 of the axis PX. In a case where the second axis AX2 is coincident with the axis PX (in a case where the holding structure 18 is not inclined), the value ϕ of the inclination angle AN of the second axis AX2 is zero. Details of the holding structure 18 will be described later.

Assuming that the distance from the center CE of the surface FS of the wafer W to the surface 194a of the dielectric plate 194 is H [mm], H can be expressed by $H = L + R \times (1 - \cos(\phi))$ [mm]. When ϕ monotonically increases in a range of 0 degrees to +180 degrees, H monotonically increases, and when ϕ monotonously increases in a range of −180 degrees to 0 degrees, H decreases monotonously. In a case where ϕ is 0 degrees, H becomes the minimum value (H=L [mm]), and in a case where ϕ is ±180 degrees, H becomes the maximum value (H=L+2×R [mm]).

In a case where a plasma is generated in the space S, a value (NE) of an electron density of the center CE of the surface FS of the wafer W can be estimated by a global model. The global model is a model that approximates a uniform cylindrical plasma. In a cylindrical shape, since an ion generation rate and an ion loss rate are same, when the structure and pressure of the cylindrical shape are determined, an electron temperature is calculated, and when the electron temperature and an input power are determined, the value (NE) of an electron density can be calculated. Using this model, the value (NE) of the electron density can be approximately proportional to 1/H (NE ∝1/H). Therefore, considering that $1/H=1/(L+R\times(1-\cos(\phi)))$, regarding the value (NE) of the electron density of the center CE of the surface FS of the wafer W, when $\phi$ monotonously increases in a range of 0 degrees to +180 degrees, the NE monotonously decreases, and when $\phi$ monotonously increases in a range of −180 degrees to 0 degrees, the NE monotonously increases. In a case where $\phi$ is 0 degrees, the NE becomes the maximum value, and in a case where $\phi$ is ±180 degrees, the NE becomes the minimum value. That is, since the NE is relatively large in a case where $\phi$ is near 0 degrees (for example, in a case where $\phi$ is in a range of −30 degrees to +30 degrees), anisotropic etching is suitable, since the NE is relatively small in a case where $\phi$ is near ±180 degrees (for example, in a case where $\phi$ is in a range of −180 degrees to −150 degrees and +150 degrees to +180 degrees), isotropic etching is suitable.

The exhaust system 20 is configured to reduce the pressure in the processing container 12. In the embodiment, the exhaust system 20 includes the automatic pressure controller 20a, a turbomolecular pump 20b, and a dry pump 20c. The turbomolecular pump 20b is provided downstream of the automatic pressure controller 20a. The dry pump 20c is directly connected to the space inside the processing container 12 via a valve 20d. In addition, the dry pump 20c is provided downstream of the turbomolecular pump 20b via a valve 20e.

The exhaust system including the automatic pressure controller 20a and the turbomolecular pump 20b is attached to the bottom portion of the processing container 12. Furthermore, the exhaust system including the automatic pressure controller 20a and the turbomolecular pump 20b is provided immediately below the holding structure 18. Therefore, in the plasma processing apparatus 10, a uniform exhaust flow from the periphery of the holding structure 18 to the exhaust system 20 can be formed. As a result, efficient exhaust can be achieved. In addition, it is possible to uniformly diffuse the plasma generated in the processing container 12.

In the embodiment, a rectifying member 26 may be provided in the processing container 12. The rectifying member 26 has a substantially tubular shape with a closed lower end. The rectifying member 26 extends along the inner wall surface of the processing container 12 so as to surround the holding structure 18 from the side and below. In an example, the rectifying member 26 has an upper portion 26a and a lower portion 26b. The upper portion 26a has a cylindrical shape with a constant width and extends along the inner wall surface of the intermediate part 12a of the processing container 12. The lower portion 26b is connected to the upper portion 26a from below the upper portion 26a. The lower portion 26b has a tapered shape with a width gradually decreasing along the inner wall surface of the processing container 12, and has a flat plate shape at its lower end. A large number of openings (through-holes) are formed in the lower portion 26b. With the rectifying member 26, it is possible to form a pressure difference between the inside of the rectifying member 26, that is, the space in which the wafer W is accommodated, and the outside of the rectifying member 26, that is, the space on the exhaust side, so that the retention time of the gas in the space in which the wafer W is accommodated can be adjusted. Furthermore, uniform exhaust can be realized.

Figure 4:
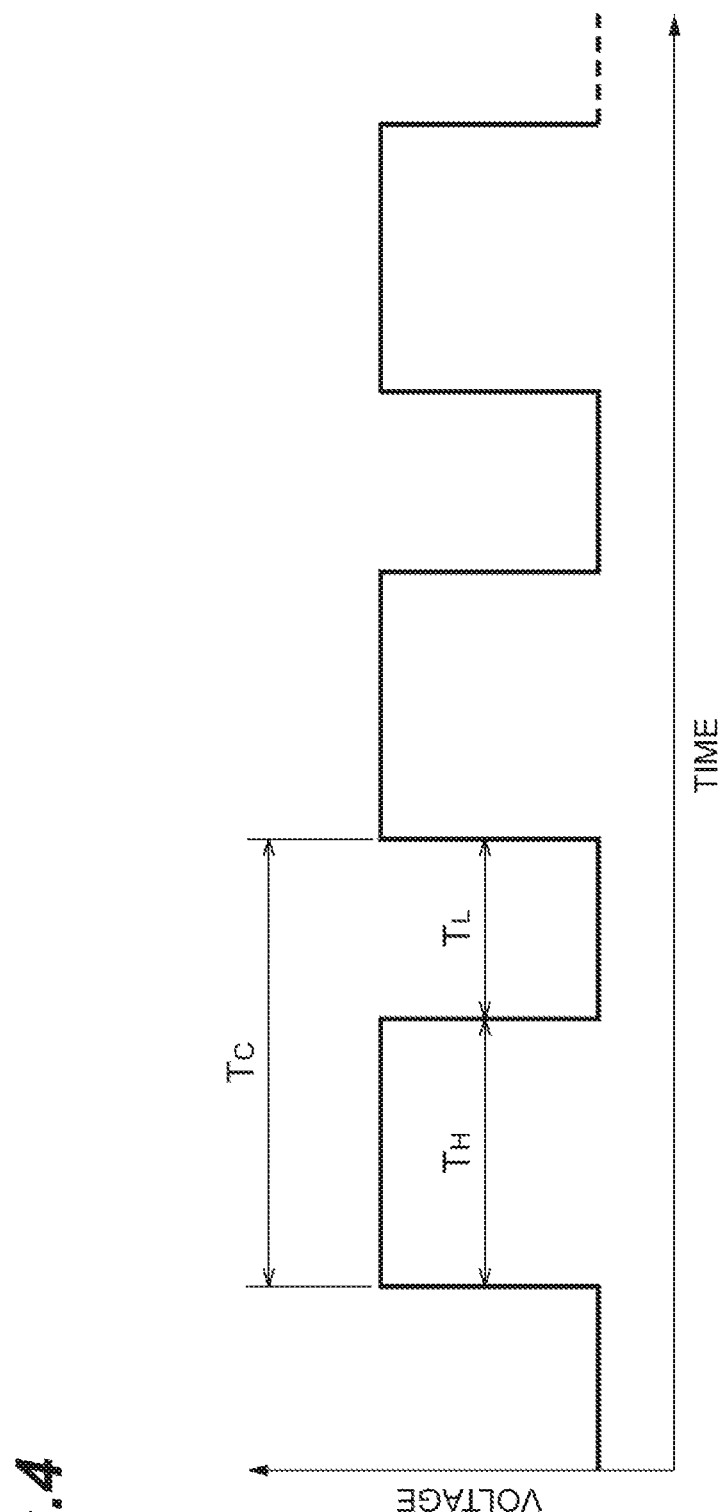
FIG. 4 is a view showing a pulse-modulated bias voltage.

The bias power supply portion 22 is configured to selectively apply, to the holding structure 18, a bias voltage and a high-frequency bias power to attract ions to the wafer W. In the embodiment, the bias power supply portion 22 includes a first power source 22a and a second power source 22b. The first power source 22a generates a pulse-modulated DC voltage (hereinafter, referred to as "modulated DC voltage") as a bias voltage to be applied to the holding structure 18. FIG. 4 is a diagram showing the pulse-modulated DC voltage. As illustrated in FIG. 4, the modulated DC voltage is a voltage such that a duration $T_H$ during which the voltage value is at a high level and a duration $T_L$ during which the voltage value is at a low level are alternately repeated. The modulated DC voltage can be set to a voltage value within a range of, for example, 0 to 1200 [V]. The voltage value of the modulated DC voltage at the high level is a voltage value set in a range of the voltage value and the voltage value of the modulated DC voltage at the high level is a voltage value lower than the voltage value at the high level. As shown in FIG. 4, the sum of the duration $T_H$ and the duration $T_L$ continuous with the duration $T_H$ constitutes one period $T_C$. The frequency of the pulse modulation of the modulated DC voltage is $1/T_C$. The frequency of the pulse modulation can be set in any way, but is a frequency at which a sheath that enables ion acceleration can be formed, for example, 400 [kHz]. In addition, the on-duty ratio, that is, the proportion of the duration TH in one period $T_C$ is a ratio in a range of 10% to 90%.

The second power source 22b is configured to supply, to the holding structure 18, the high-frequency bias power for attracting ions to the wafer W. The frequency of the high-frequency bias power is an arbitrary frequency suitable for attracting ions to the wafer W, and is desirably 400 [kHz] to 13 [MHz], for example, 400 [kHz]. In the plasma processing apparatus 10, the modulated DC voltage from the first power source 22a and the high-frequency bias power from the second power source 22b can be selectively supplied to the holding structure 18. The selective supply of the modulated DC voltage and the high-frequency bias power can be controlled by the control unit Cnt.

The control unit Cnt is, for example, a computer including a processor, a storage unit, an input device, a display device, and the like. The control unit Cnt operates according to a program based on an input recipe and transmits a control signal. Each portion of the plasma processing apparatus 10 is controlled by the control signal from the control unit Cnt. In particular, the control unit Cnt executes the method MT shown in the flowchart of FIG. 1 by using each portion of the plasma processing apparatus 10.

Hereinafter, each of the gas supply system 14, the plasma source 16, and the holding structure 18 will be described.

[Gas Supply System]

The gas supply system 14 has the gas supply portion 14a as described above. The gas supply portion 14a supplies a processing gas into the processing container 12 through one or more gas discharge holes 14e. In FIG. 2, the number of gas discharge holes 14e is "1", but a plurality of gas discharge holes 14e may be provided. The plurality of gas discharge holes 14e may be uniformly arranged in a circumferential direction with respect to the axis PX.

The gas supply portion 14a may have one or more gas sources, one or more flow controllers, and one or more valves. Therefore, the flow rate of the processing gas from the one or more gas sources of the gas supply portion 14a is adjustable. The flow rate of the processing gas from the gas supply portion 14a and the timing of supply of the processing gas are individually adjusted by the control unit Cnt.

[Plasma Source]

Figure 5:
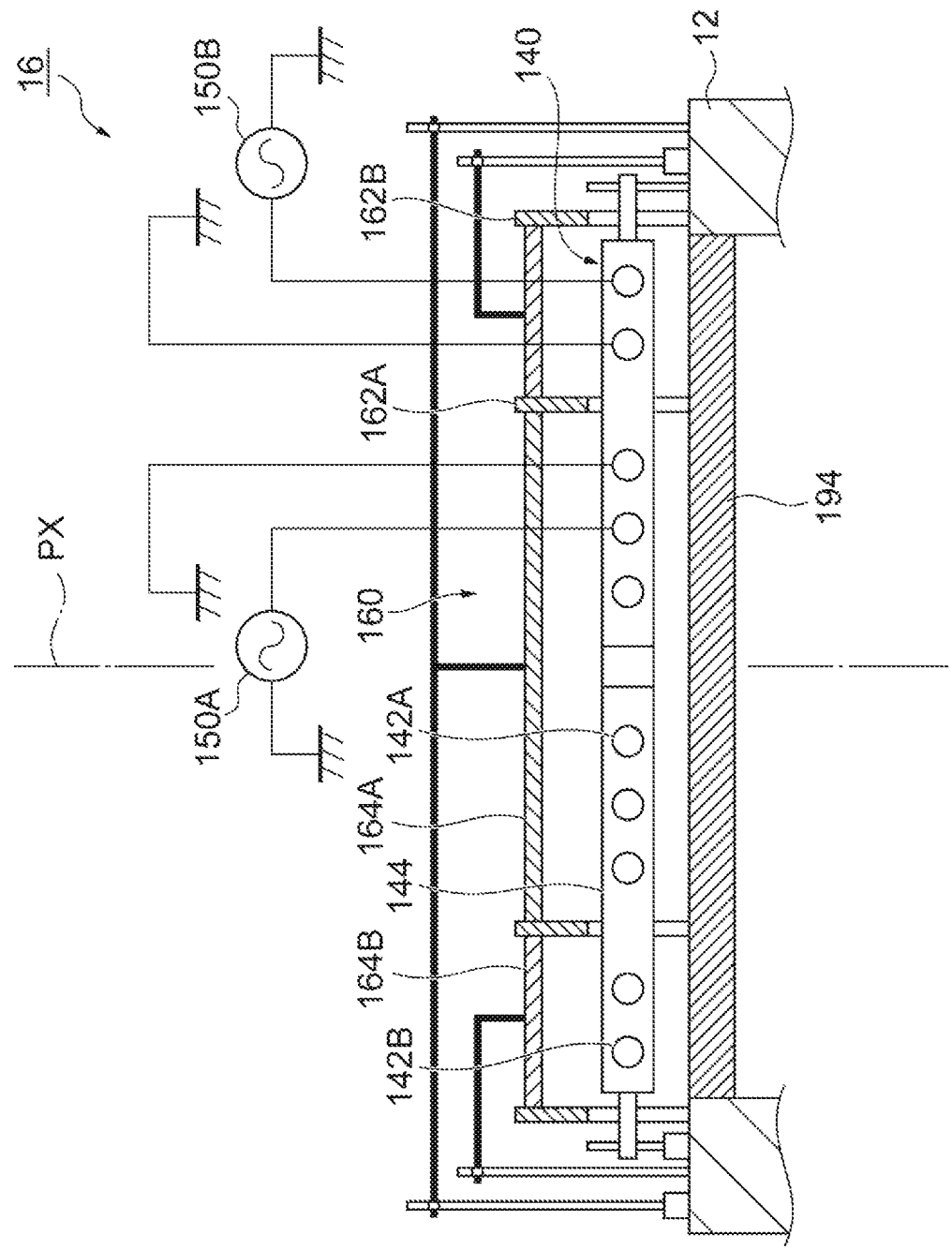
FIG. 5 is a view illustrating a plasma source of the embodiment.
Figure 6:
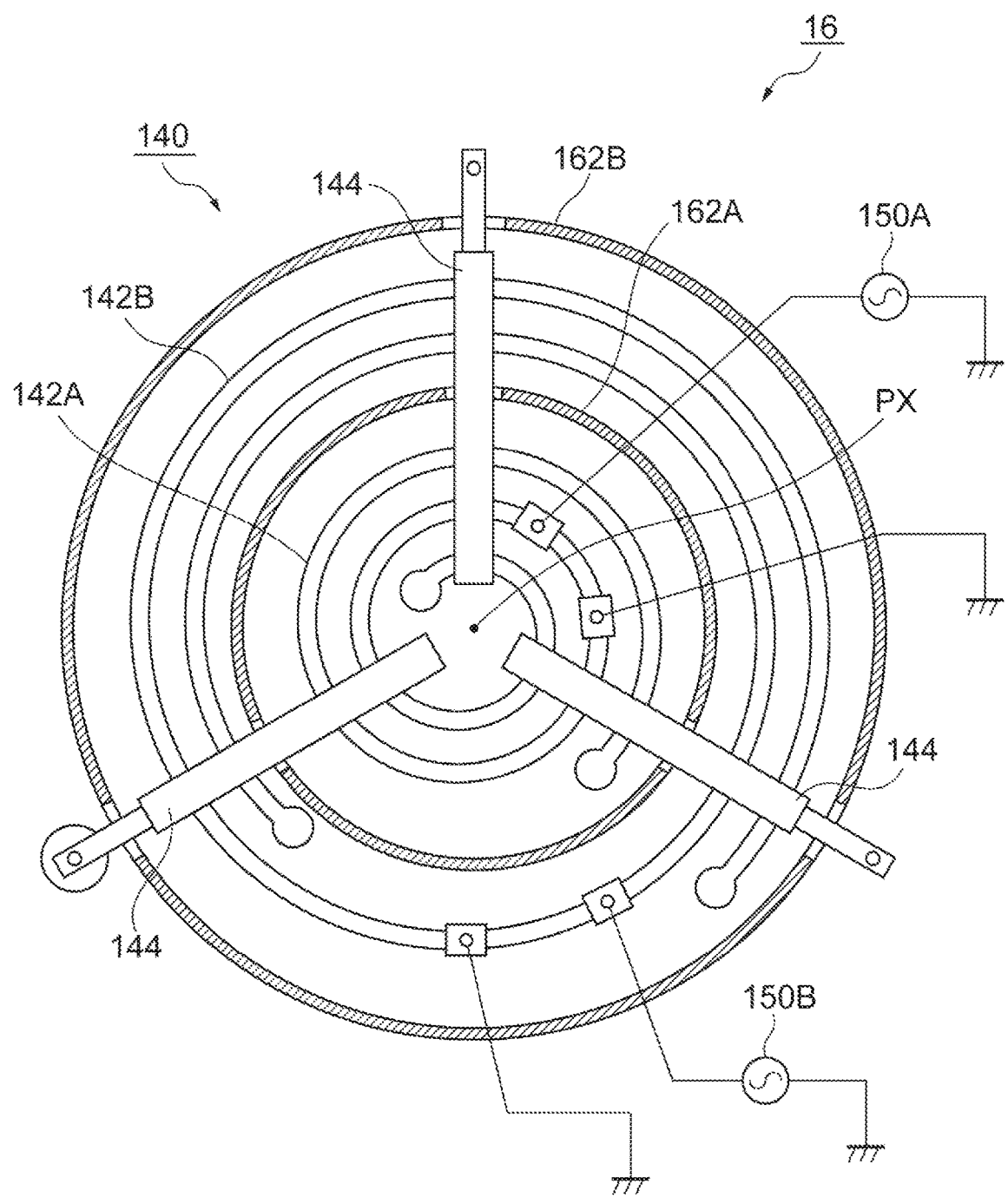
FIG. 6 is a view illustrating the plasma source of the embodiment.

FIG. 5 is a view illustrating the plasma source of the embodiment, and illustrates the plasma source viewed in the Y direction in FIG. 2. FIG. 6 is a view illustrating the plasma source of the embodiment, and illustrates the plasma source viewed in the vertical direction. As illustrated in FIGS. 2 and 5, the top portion of the processing container 12 is provided with an opening, and the opening is closed by the dielectric plate 194. The dielectric plate 194 is a plate-shaped body and is made of quartz glass or ceramic. The plasma source 16 is provided on the dielectric plate 194.

More specifically, as illustrated in FIGS. 5 and 6, the plasma source 16 has a high-frequency antenna 140 and a shield member 160. The high-frequency antenna 140 is covered with the shield member 160. In the embodiment, the high-frequency antenna 140 includes an inner antenna element 142A and an outer antenna element 142B. The inner antenna element 142A is provided closer to the axis PX than the outer antenna element 142B. In other words, the outer antenna element 142B is provided outside the inner antenna element 142A so as to surround the inner antenna element 142A. Each of the inner antenna element 142A and the outer antenna element 142B is made of a conductor such as copper, aluminum, or stainless steel, and extends in a spiral shape around the axis PX.

Both of the inner antenna element 142A and the outer antenna element 142B are interposed by a plurality of interposing bodies 144 and are thus integrated. The plurality of interposing bodies 144 are, for example, rod-shaped members and are disposed radially with respect to the axis PX.

The shield member 160 has an inner shield wall 162A and an outer shield wall 162B. The inner shield wall 162A has a tubular shape extending in the vertical direction and is provided between the inner antenna element 142A and the outer antenna element 142B. The inner shield wall 162A surrounds the inner antenna element 142A. In addition, the outer shield wall 162B has a cylindrical shape extending in the vertical direction and is provided so as to surround the outer antenna element 142B.

An inner shield plate 164A is provided on the inner antenna element 142A. The inner shield plate 164A has a disk shape and is provided so as to close the opening of the inner shield wall 162A. An outer shield plate 164B is provided on the outer antenna element 142B. The outer shield plate 164B is an annular plate and is provided so as to close the opening between the inner shield wall 162A and the outer shield wall 162B.

A high-frequency power source 150A and a high-frequency power source 150B are respectively connected to the inner antenna element 142A and the outer antenna element 142B, respectively. The high-frequency power source 150A and the high-frequency power source 150B are high-frequency power sources for plasma generation. The high-frequency power source 150A and the high-frequency power source 150B supply high frequency power at the same frequency or different frequencies to the inner antenna element 142A and the outer antenna element 142B, respectively. For example, when high-frequency power at a predetermined frequency (for example, 40 [MHz]) is supplied from the high-frequency power source 150A to the inner antenna element 142A at a predetermined power, the processing gas introduced into the processing container 12 is excited by an induced magnetic field formed in the processing container 12 such that a donut-shaped plasma is generated in a center portion above the wafer W. When a high-frequency wave at a predetermined frequency (for example, 60 [MHz]) is supplied to the outer antenna element 142B from the high-frequency power source 150B at a predetermined power, the processing gas introduced into the processing container 12 is excited by an induced magnetic field formed in the processing container 12 such that another donut-shaped plasma is generated in a peripheral portion above the wafer W. These plasmas generate radicals from the process gas.

The frequencies of the high-frequency power output from the high-frequency power source 150A and the high-frequency power source 150B are not limited to the above-described frequencies. For example, the frequencies of the high-frequency power output from the high-frequency power source 150A and the high-frequency power source 150B may be various frequencies such as 13.56 [MHz], 27 [MHz], 40 [MHz] and 60 [MHz]. However, it is necessary to adjust the electrical lengths of the inner antenna element 142A and the outer antenna element 142B according to the high frequencies output from the high-frequency power source 150A and the high-frequency power source 150B.

The plasma source 16 can ignite the plasma of the processing gas even under an environment of a pressure of 1 [mTorr] (0.1333 [Pa]). Under the low-pressure environment, the mean free path of the ions in the plasma becomes large. Therefore, it is possible to perform etching by sputtering of ions of rare gas. In addition, under the low-pressure environment, it is possible to discharge the etched material while suppressing the re-adhesion of the material to the wafer W.

Figure 7:
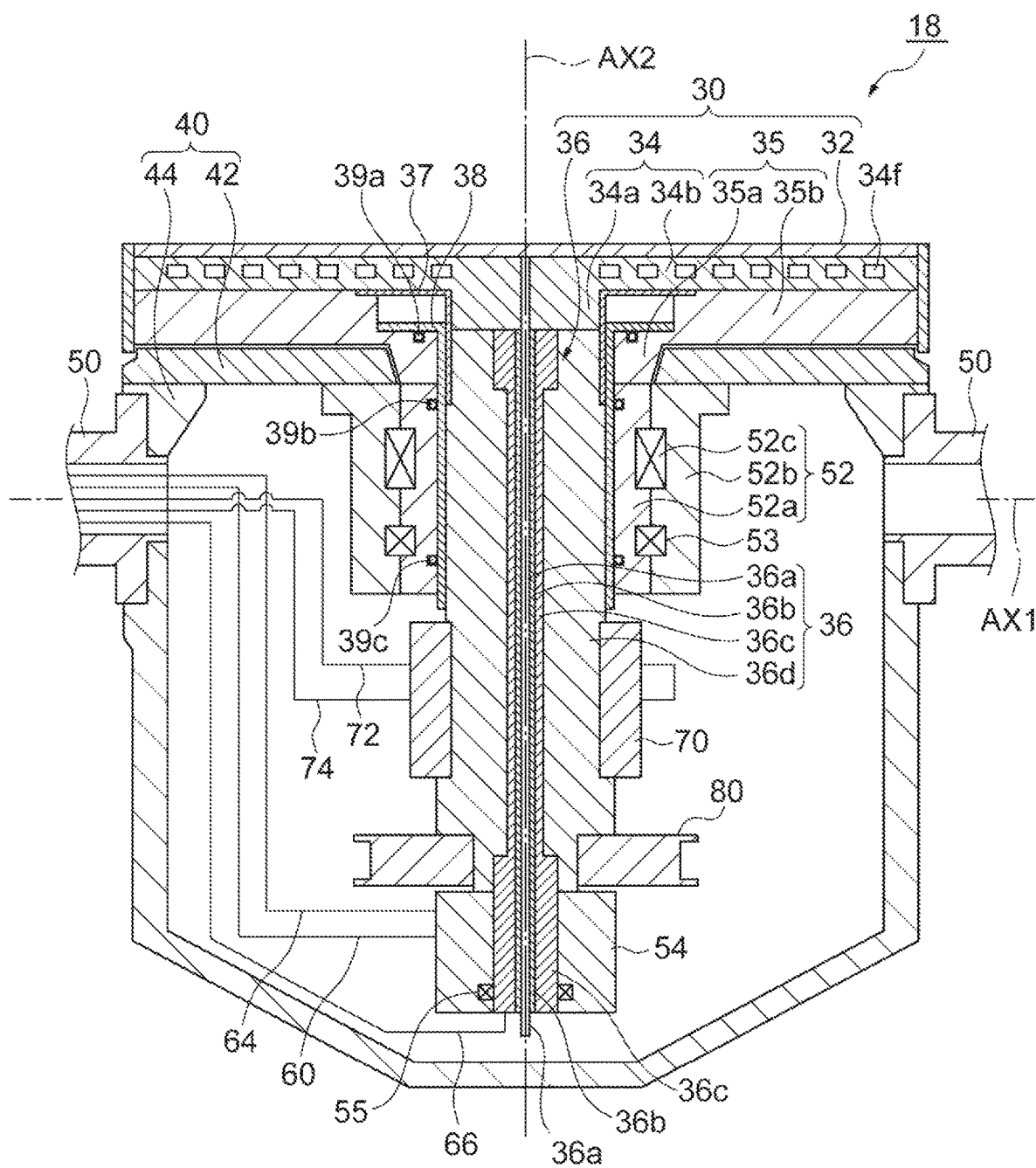
FIG. 7 is a sectional view illustrating a holding structure according to the embodiment.
Figure 8:
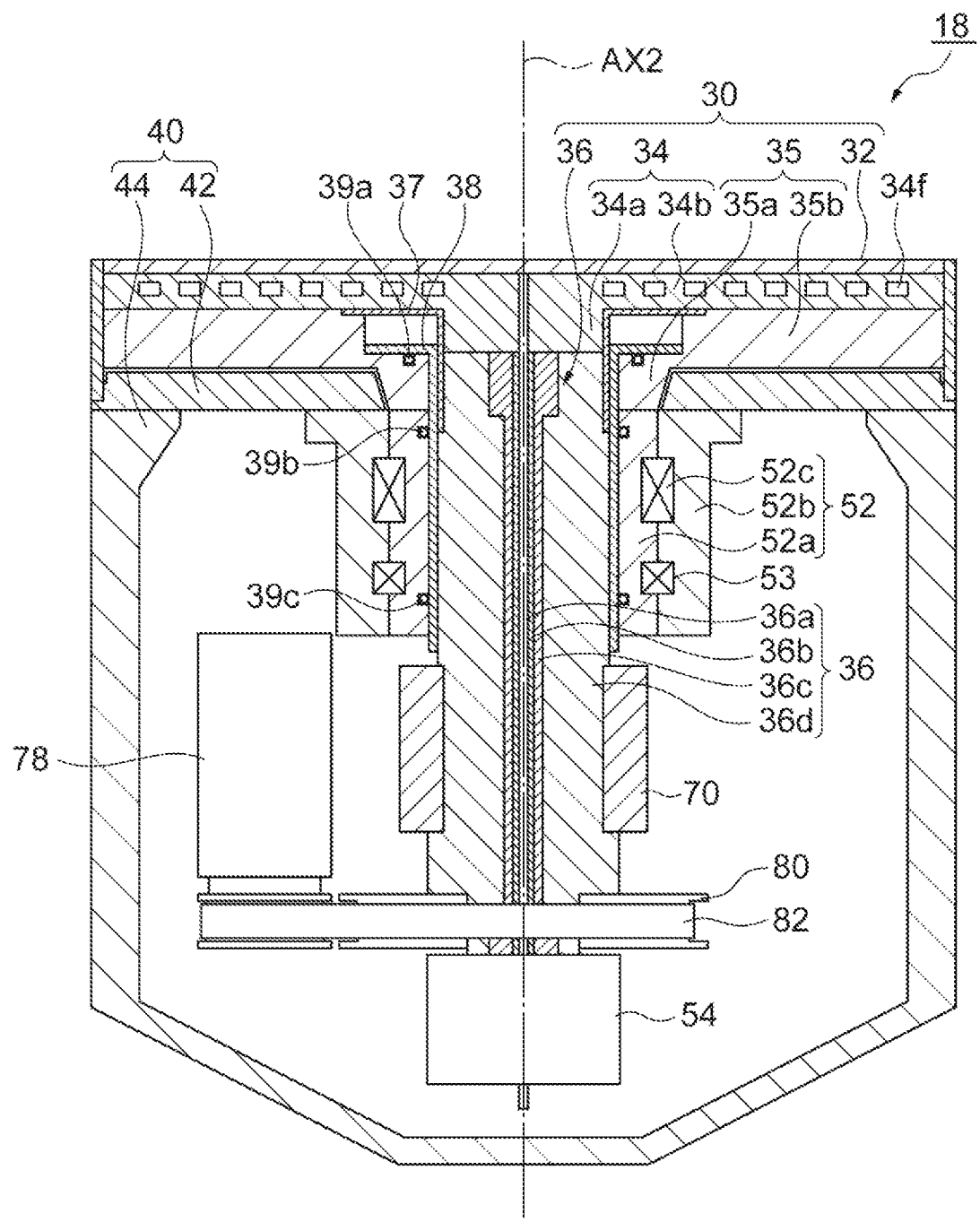
FIG. 8 is a sectional view illustrating the holding structure according to the embodiment.

[Holding Structure] FIGS. 7 and 8 are sectional views illustrating the holding structure according to the embodiment. FIG. 7 illustrates a sectional view of the holding structure viewed in the Y direction (see FIG. 2), and FIG. 8 illustrates a sectional view of the holding structure viewed in the X direction (see FIG. 2). As illustrated in FIGS. 7 and 8, the holding structure 18 includes the holding portion 30, a container portion 40, and the inclination shaft portion 50.

The holding portion 30 is a mechanism that holds the wafer W and rotates the wafer W by rotating about the second axis AX2. In addition, as described above, the second axis AX2 is coincident with the axis PX in a state in which the holding structure 18 is not inclined. The holding portion 30 includes an electrostatic chuck 32, a lower electrode 34, a rotating shaft portion 36, and an insulating member 35.

The electrostatic chuck 32 is configured to hold the wafer W on its upper surface. The electrostatic chuck 32 has a substantially disk shape having the second axis AX2 as its center axis, and has an electrode film provided as an inner layer of an insulating film. The electrostatic chuck 32 generates an electrostatic force as a voltage is applied to the electrode film. Due to the electrostatic force, the electrostatic chuck 32 causes the wafer W placed on its upper surface to be adsorbed thereon. A heat transfer gas such as He gas is supplied between the electrostatic chuck 32 and the wafer W. Furthermore, a heater for heating the wafer W may be embedded in the electrostatic chuck 32. The electrostatic chuck 32 is provided on the lower electrode 34.

The lower electrode 34 has a substantially disk shape having the second axis AX2 as its center axis. In the embodiment, the lower electrode 34 has a first part 34a and a second part 34b. The first part 34a is a part on the center side of the lower electrode 34 extending along the second axis AX2, and the second part 34b is a part that is located farther away from the second axis AX2 than the first part 34a, that is, extends outward from the first part 34a. The upper surface of the first part 34a and the upper surface of the second part 34b are continuous, and the upper surface of the first part 34a and the upper surface of the second part 34b constitute a substantially flat upper surface of the lower electrode 34. The electrostatic chuck 32 is in contact with the upper surface of the lower electrode 34. In addition, the first part 34a protrudes downward from the second part 34b and has a cylindrical shape. That is, the lower surface of the first part 34a extends below the lower surface of the second part 34b. The lower electrode 34 is made of a conductor such as aluminum. The lower electrode 34 is electrically connected to the above-described bias power supply portion 22. That is, the modulated DC voltage from the first power source 22a and the high-frequency bias power from the second power source 22b can be selectively supplied to the lower electrode 34. In addition, the lower electrode 34 is provided with a coolant flow path 34f. As a coolant is supplied to the coolant flow path 34f, the temperature of the wafer W is controlled. The lower electrode 34 is provided on the insulating member 35.

The insulating member 35 is made of an insulator such as quartz or alumina, and has a substantially disk shape that opens at the center. In the embodiment, the insulating member 35 has a first part 35a and a second part 35b. The first part 35a is a center side part of the insulating member 35, and the second part 35b is a part that is located farther away from the second axis AX2 than the first part 35a, that is, extends outward from the first part 35a. The upper surface of the first part 35a extends below the upper surface of the second part 35b, and the lower surface of the first part 35a also extends below the lower surface of the second part 35b. The upper surface of the second part 35b of the insulating member 35 is in contact with the lower surface of the second part 34b of the lower electrode 34. On the other hand, the upper surface of the first part 35a of the insulating member 35 is spaced apart from the lower surface of the lower electrode 34.

The rotating shaft portion 36 has a substantially cylindrical shape and is joined to the lower surface of the lower electrode 34. Specifically, the rotating shaft portion 36 is joined to the lower surface of the first part 34a of the lower electrode 34. The center axis of the rotating shaft portion 36 is coincident with the second axis AX2. As a rotational force is applied to the rotating shaft portion 36, the holding portion 30 is rotated.

The holding portion 30 constituted by such various elements forms a hollow space as the internal space of the holding structure 18 together with the container portion 40. The container portion 40 includes an upper container portion 42 and an outer container portion 44. The upper container portion 42 has a substantially disk shape. At the center of the upper container portion 42, a through-hole through which the rotating shaft portion 36 passes is formed. The upper container portion 42 is provided so as to provide a slight gap from the second part 35b below the second part 35b of the insulating member 35. The upper end of the outer container portion 44 is joined to the circumferential edge of the lower surface of the upper container portion 42. The outer container portion 44 has a substantially cylindrical shape closed at the lower end.

A magnetic fluid seal portion 52 is provided between the container portion 40 and the rotating shaft portion 36. The magnetic fluid seal portion 52 includes an inner ring portion 52a and an outer ring portion 52b. The inner ring portion 52a has a substantially cylindrical shape extending coaxially with the rotating shaft portion 36 and is fixed to the rotating shaft portion 36. The upper end portion of the inner ring portion 52a is joined to the lower surface of the first part 35a of the insulating member 35. The inner ring portion 52a is configured to rotate together with the rotating shaft portion 36 about the second axis AX2. The outer ring portion 52b has a substantially cylindrical shape and is provided coaxially with the inner ring portion 52a on the outside of the inner ring portion 52a. The upper end portion of the outer ring portion 52b is joined to the lower surface of the center side part of the upper container portion 42. A magnetic fluid 52c is interposed between the inner ring portion 52a and the outer ring portion 52b. A bearing 53 is provided between the inner ring portion 52a and the outer ring portion 52b below the magnetic fluid 52c. This magnetic fluid seal portion 52 provides a sealing structure for airtightly sealing the internal space of the holding structure 18. With this magnetic fluid seal portion 52, the internal space of the holding structure 18 is separated from the space S of the plasma processing apparatus 10. In the plasma processing apparatus 10, the internal space of the holding structure 18 is maintained at atmospheric pressure.

In the embodiment, a first member 37 and a second member 38 are provided between the magnetic fluid seal portion 52 and the rotating shaft portion 36. The first member 37 has a substantially cylindrical shape extending along a part of the outer circumferential surface of the rotating shaft portion 36, that is, the outer circumferential surface of the upper part of a third tubular portion 36d, which will be described later, and the outer circumferential surface of the first part 34a of the lower electrode 34. The upper end of the first member 37 has an annular plate shape extending along the lower surface of the second part 34b of the lower electrode 34. The first member 37 is in contact with the outer circumferential surface of the upper part of the third tubular portion 36d, the outer circumferential surface of the first part 34a of the lower electrode 34, and the lower surface of the second part 34b.

The second member 38 has a substantially cylindrical shape extending along the outer circumferential surface of the rotating shaft portion 36, that is, the outer circumferential surface of the third tubular portion 36d, and the outer circumferential surface of the first member 37. The upper end of the second member 38 has an annular plate shape extending along the upper surface of the first part 35a of the insulating member 35. The second member 38 is in contact with the outer circumferential surface of the third tubular portion 36d, the outer circumferential surface of the first member 37, the upper surface of the first part 35a of the insulating member 35, and the inner circumferential surface of the inner ring portion 52a of the magnetic fluid seal portion 52. A sealing member 39a such as an O-ring is interposed between the second member 38 and the upper surface of the first part 35a of the insulating member 35. A sealing member 39b and a sealing member 39c such as an O-ring are interposed between the second member 38 and the inner circumferential surface of the inner ring portion 52a of the magnetic fluid seal portion 52. With such a structure, the space between the rotating shaft portion 36 and the inner ring portion 52a of the magnetic fluid seal portion 52 is sealed. Accordingly, even if there is a gap between the rotating shaft portion 36 and the magnetic fluid seal portion 52, the internal space of the holding structure 18 is separated from the space S of the plasma processing apparatus 10.

The outer container portion 44 has an opening formed along the first axis AX1. The inner end portion of the inclination shaft portion 50 is fitted into the opening formed in the outer container portion 44. The inclination shaft portion 50 has a substantially cylindrical shape, and its center axis is coincident with the first axis AX1. The inclination shaft portion 50 intersects with the holding structure 18. As illustrated in FIG. 2, the inclination shaft portion 50 extends to the outside of the processing container 12. The above-described driving device 24 is joined to both outer end portions of the inclination shaft portion 50. The driving device 24 pivotally supports both outer end portions of the inclination shaft portion 50. As the inclination shaft portion 50 is rotated by the driving device 24, the holding structure 18 is rotated about the first axis AX1, and as a result, the holding structure 18 is inclined with respect to the axis PX. The holding structure 18 can be inclined such that the value φ (degrees) of the inclination angle AN of the second axis AX2 with respect to the axis PX forms an angle in a range of −180 degrees to +180 degrees [degrees] (that is, it is possible for the holding structure 18 to make one rotation (360-degree rotation) about the first axis AX1).

In the embodiment, the first axis AX1 includes the center position of the holding structure 18 in the direction of the second axis AX2. In this embodiment, the inclination shaft portion 50 extends on the first axis AX1 passing through the center of the holding structure 18.

In another embodiment, the first axis AX1 includes a position between the center of the holding structure 18 in the direction of the second axis AX2 and the upper surface of the holding portion 30. That is, in this embodiment, the inclination shaft portion 50 extends at a position biased toward the holding portion 30 side from the center of the holding structure 18. According to this embodiment, when the holding structure 18 is inclined, the difference in distance between the plasma source 16 and each position of the wafer W can be reduced. Therefore, in-plane uniformity of etching is further improved.

In still another embodiment, the first axis AX1 includes the centroid of the holding structure 18. In this embodiment, the inclination shaft portion 50 extends on the first axis AX1 including the centroid. According to this embodiment, the torque required for the driving device 24 becomes small, and the control of the driving device 24 is facilitated.

Returning to FIGS. 7 and 8, wires for various electrical systems, pipes for the heat transfer gas, and pipes for the coolant are passed through the inner hole of the inclination shaft portion 50. These wires and pipes are connected to the rotating shaft portion 36.

The rotating shaft portion 36 has a columnar portion 36a, a first tubular portion 36b, a second tubular portion 36c, and the third tubular portion 36d. The columnar portion 36a has a substantially cylindrical shape and extends on the second axis AX2. The columnar portion 36a is a wire for applying a voltage to the electrode film of the electrostatic chuck 32. The columnar portion 36a is connected to a wire 60 via a rotary connector 54 such as a slip ring. The wire 60 extends from the internal space of the holding structure 18 through the inner hole of the inclination shaft portion 50 to the outside of the processing container 12. The wire 60 is connected to a power source 62 (see FIG. 2) via a switch outside the processing container 12.

The first tubular portion 36b is provided coaxially with the columnar portion 36a on the outside of the columnar portion 36a. The first tubular portion 36b is a wire for supplying the modulated DC voltage and the high-frequency bias power to the lower electrode 34. The first tubular portion 36b is connected to a wire 64 via the rotary connector 54. The wire 64 extends from the inner space of the holding structure 18 through the inner hole of the inclination shaft portion 50 to the outside of the processing container 12. The wire 64 is connected to the first power source 22a and the second power source 22b of the bias power supply portion 22 outside the processing container 12. A matching device for impedance matching may be provided between the second power source 22b and the wire 64.

The second tubular portion 36c is provided coaxially with the first tubular portion 36b on the outside of the first tubular portion 36b. In the embodiment, a bearing 55 is provided in the rotary connector 54 described above, and the bearing 55 extends along the outer circumferential surface of the second tubular portion 36c. The bearing 55 supports the rotating shaft portion 36 via the second tubular portion 36c. The above-described bearing 53 supports the upper part of the rotating shaft portion 36, whereas the bearing 55 supports the lower part of the rotating shaft portion 36. Since both the upper part and the lower part of the rotating shaft portion 36 are supported by the two bearings 53 and 55 in this way, it is possible to stably rotate the rotating shaft portion 36 about the second axis AX2.

A gas line for supplying the heat transfer gas is formed in the second tubular portion 36c. This gas line is connected to a pipe 66 via a rotary joint such as a swivel joint. The pipe 66 extends from the inner space of the holding structure 18 through the inner hole of the inclination shaft portion 50 to the outside of the processing container 12. The pipe 66 is connected to a heat transfer gas source 68 (see FIG. 2) outside the processing container 12.

The third tubular portion 36d is provided coaxially with the second tubular portion 36c outside the second tubular portion 36c. A coolant supply line through which the coolant can be supplied to the coolant flow path 34f and a coolant recovery line through which the coolant is supplied to the coolant flow path 34f are formed in the third tubular portion 36d. The coolant supply line is connected to a pipe 72 via a rotary joint 70 such as a swivel joint. Furthermore, the coolant recovery line is connected to a pipe 74 via the rotary joint 70. The pipe 72 and the pipe 74 extend from the internal space of the holding structure 18 through the inner hole of the inclination shaft portion 50 to the outside of the processing container 12. The pipe 72 and the pipe 74 are connected to a chiller unit 76 (see FIG. 2) outside the processing container 12.

Furthermore, as illustrated in FIG. 8, a rotary motor 78 is provided in the internal space of the holding structure 18. The rotary motor 78 generates a driving force for rotating the rotating shaft portion 36. In the embodiment, the rotary motor 78 is provided on the side of the rotating shaft portion 36. The rotary motor 78 is connected to a pulley 80 attached to the rotating shaft portion 36 via a transmission belt 82. Accordingly, the rotational driving force of the rotary motor 78 is transmitted to the rotating shaft portion 36, and the holding portion 30 rotates about the second axis AX2. The rotation speed of the holding portion 30 is, for example, within a range of 50 [rpm] or less. For example, the holding portion 30 is rotated at a rotation speed of 10 [rpm] during the process. The wire for supplying power to the rotary motor 78 is drawn to the outside of the processing container 12 through the inner hole of the inclination shaft portion 50 and is connected to a motor power source provided outside the processing container 12. In the following description, unless otherwise mentioned, it is assumed that the rotation speed [rpm] of the holding portion 30 is the same value (for example, 10 [rpm]).

As described above, the holding structure 18 can provide various mechanisms in the internal space that can be maintained at atmospheric pressure. In addition, the holding structure 18 is configured such that the wires and pipes for connection from the mechanisms accommodated in the internal space to the devices such as the power sources, the gas source, and the chiller unit provided outside the processing container 12 are drawn to the outside of the processing container 12. In addition to the wires and pipes described above, a wire for connection from a heater power source provided outside the processing container 12 to the heater provided in the electrostatic chuck 32 may be drawn from the internal space of the holding structure 18 to the outside of the processing container 12 through the inner hole of the inclination shaft portion 50.

[Method for processing workpiece] Hereinafter, the method for processing a workpiece according to the embodiment will be described. FIG. 1 is a flowchart showing an example of the method (method MT) for processing a workpiece according to the embodiment. In a step ST1 of the method MT, the wafer W is prepared so that the wafer W to be processed is held on the holding structure 18 of the plasma processing apparatus 10. The wafer W has a layer dominated by anisotropic etching and a layer dominated by isotropic etching.

In a step ST2 (first step) subsequent to the step ST1, in a state ($\phi=\phi1$) in which the first direction VL1 and the second direction VL2 are maintained at a first angle $\phi1$, a plasma is generated in the processing container 12 in which the wafer W is held by the holding structure 18. In a step ST3 (second step) subsequent to the step ST2, in a state ($\phi=\phi2$) in which the first direction VL1 and the second direction VL2 are maintained at a second angle $\phi2$, a plasma is generated in the processing container 12 in which the wafer W is held by the holding structure 18.

The first angle $\phi1$ and the second angle $\phi2$ are $-180$ degrees to $+180$ degrees. The absolute value of the first angle $\phi1$ is different from the absolute value of the second angle $\phi2$. The angle with a smaller absolute value of the first angle $\phi1$ and the second angle $\phi2$ is in a range of $-30$ degrees to $+30$ degrees, and the angle with a larger absolute value is in a range of $-180$ degrees to $-150$ degrees and $+150$ degrees to $+180$ degrees.

In a case where anisotropic etching is performed on the wafer W, the value $\phi$ of the angle (inclination angle AN) between the first direction VL1 and the second direction VL2 is set to be in a range of 30 degrees to $+30$ degrees.

In a case where isotropic etching is performed on the wafer W, the value $\phi$ of the angle (inclination angle AN) between the first direction VL1 and the second direction VL2 is set to be in a range of $-180$ degrees to $-150$ degrees and $+150$ degrees to $+180$ degrees.

Example 1

Figure 9:
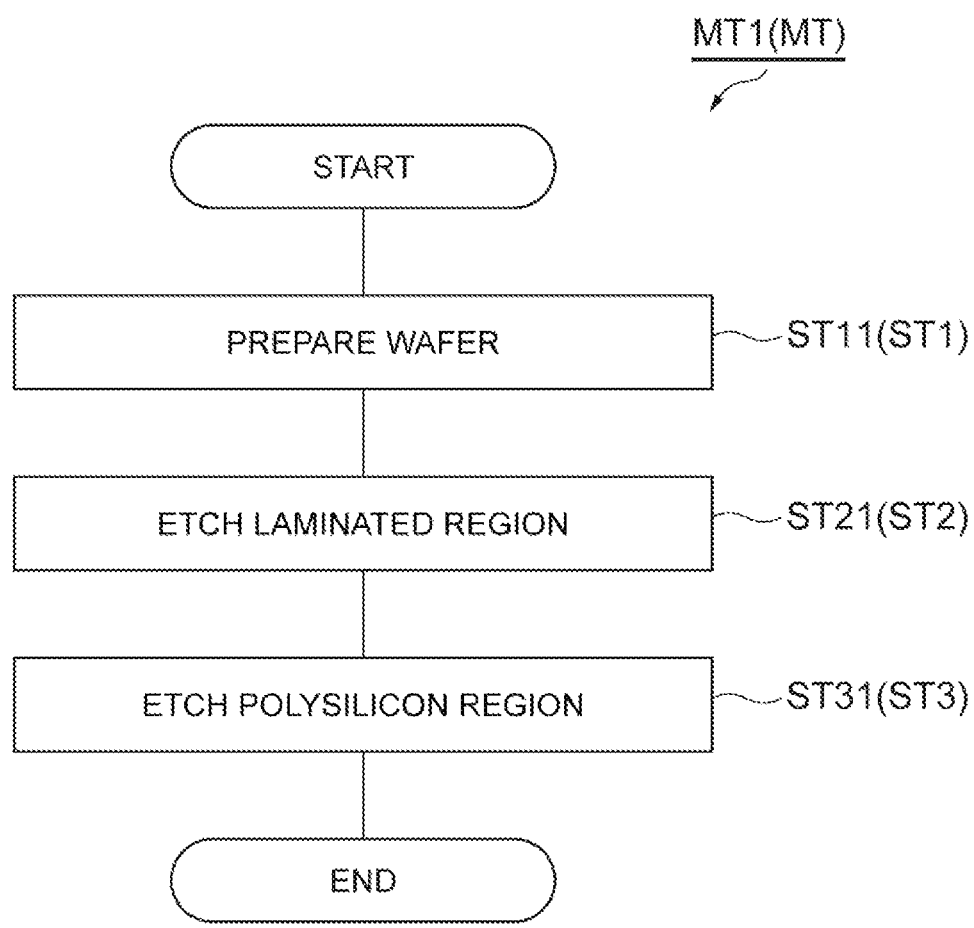
FIG. 9 is a flowchart showing an example of the method shown in FIG. 1.
Figure 10:
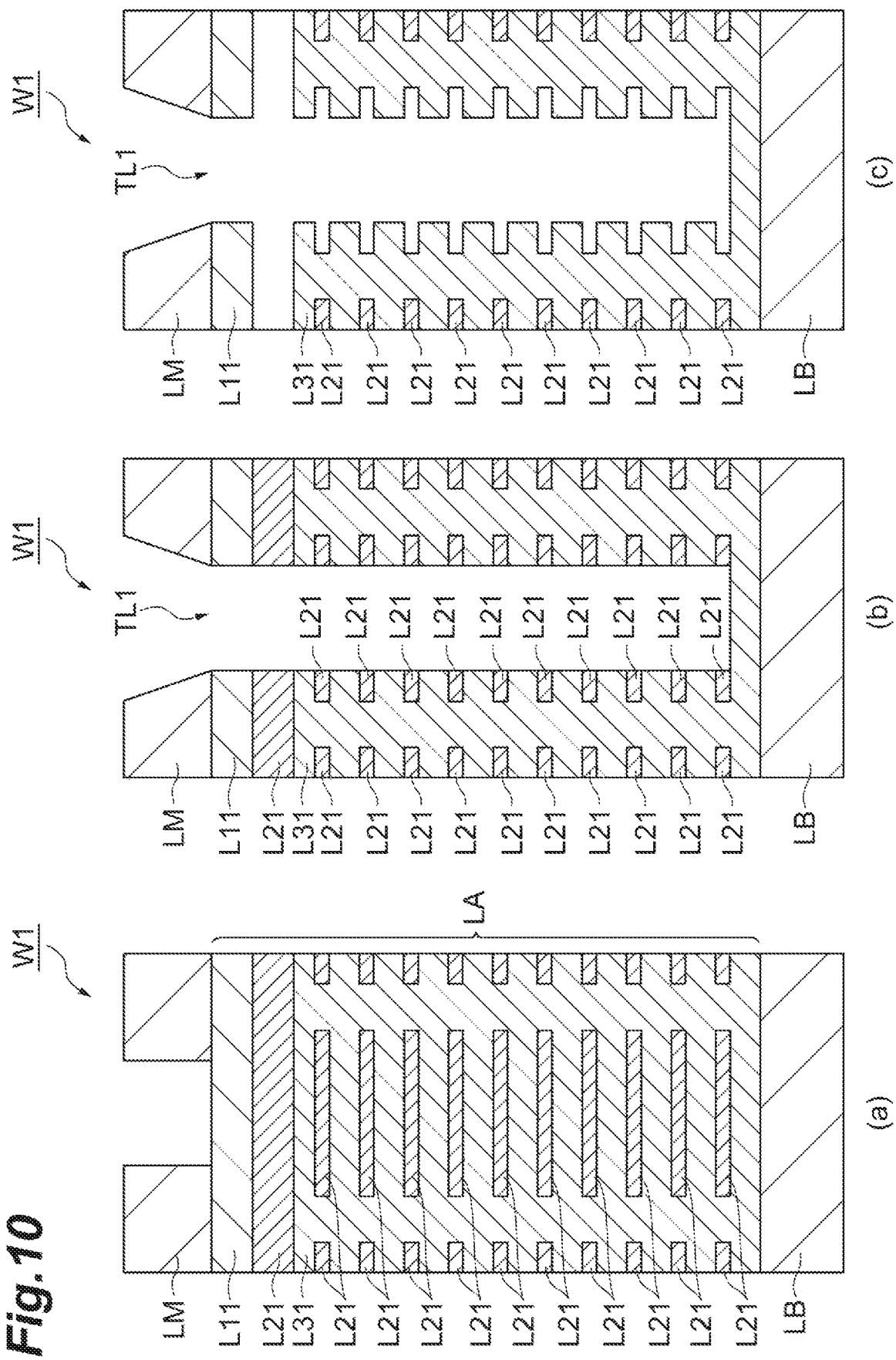
FIG. 10 includes parts (a) to (c), in which part (a) of FIG. 10 illustrates a sectional structure of a wafer before processing of the method shown in FIG. 9, and parts (b) and (c) of FIG. 10 illustrate sectional structures of the wafer after the processing of the method shown in FIG. 9.

The method MT described above can be applied to a case of etching a multilayer film of the wafer W1 illustrated in part (a) of FIG. 10. A method MT1 shown in FIG. 9 is an example of the above-described method MT and is used for processing the wafer W1. The wafer W1 (workpiece) illustrated in parts (a) to (c) of FIG. 10 is an example of the wafer W described above.

The wafer W1 illustrated in part (a) of FIG. 10 is a wafer used for manufacturing a 3D-NAND element. The wafer W1 includes a base body LB, a laminated region LA, and a mask LM. The laminated region LA includes a nitride region L11, a plurality of polysilicon regions L21 (a plurality of first layers), and a plurality of oxide regions L31 (a plurality of second layers). The nitride region L11 of the laminated region LA is composed of only one layer. The mask LM is made of an organic material and is, for example, a resist mask. The material of the nitride region L11 may be, for example, SiN. The polysilicon region L21 is a layer dominated by isotropic etching compared to the oxide region L31. The material of the polysilicon region L21 may be amorphous silicon. The material of the oxide region L31 may be, for example, $SiO_2$.

The laminated region LA is provided on the base body LB. The oxide regions L31 of the laminated region LA are disposed on the base body LB. In the laminated region LA, the polysilicon regions L21 and the oxide regions L31 are alternately laminated along the lamination direction. The mask LM is provided on the laminated region LA. In the laminated region LA, the nitride region L11 is disposed on the polysilicon region L21. The mask LM is disposed on the nitride region L11 of the laminated region LA.

The method MT1 shown in FIG. 9 includes a step ST11, a step ST21, and a step ST31. The step ST11 corresponds to the step ST1 shown in FIG. 1. The step ST21 corresponds to the step ST2 shown in FIG. 1. The step ST31 corresponds to the step ST3 shown in FIG. 1. First, in the step ST11 of the method MT1, the wafer W is prepared so that the wafer W1 illustrated in part (a) of FIG. 10, which is to be processed, is held by the holding structure 18 of the plasma processing apparatus 10.

In the step ST21 (first step) subsequent to the step ST11, as illustrated in part (b) of FIG. 10, in a state ($\phi=\phi1$) in which the first direction VL1 and the second direction VL2 are maintained at the first angle $\phi1$, the wafer W1 held by the holding structure 18 is etched by the plasma generated in the processing container 12. More specifically, in a state in which the first angle $\phi1$ is maintained in a range of $-30$ degrees to $+30$ degrees, which is suitable for anisotropic etching, the laminated region LA is etched in the lamination direction using the mask LM, and by this etching, a groove TL1 is formed in the laminated region LA.

In the step ST31 (second step) subsequent to the step ST21, as illustrated in part (c) of FIG. 10, in a state ($\phi=\phi2$) in which the first direction VL1 and the second direction VL2 are maintained at the second angle $\phi2$, the wafer W1 held by the holding structure 18 is etched by the plasma generated in the processing container 12. More specifically, in a state in which the second angle $\phi2$ is maintained in a range of $-180$ degrees to $-150$ degrees and $+150$ degrees to $+180$ degrees, which is suitable for isotropic etching, the polysilicon regions L21 exposed to the inside of the groove TL1 are etched. The absolute value of the first angle $\phi1$ is smaller than the absolute value of the second angle $\phi2$. Since the polysilicon region L21 is a layer dominated by isotropic etching compared to the oxide region L31, in the step ST31, among the polysilicon regions L21 and the oxide regions L31, only the polysilicon regions L21 can be selectively etched with a relatively high selectivity.

An example of process conditions of the steps ST21 and ST31 is shown.

<Step ST21>

In the step ST21, $H_2$ gas, $CF_4$ gas, $CHF_3$ gas, and $NF_3$ gas are introduced into the processing container 12, and high-frequency power is applied thereto using the high-frequency power source 150A and the high-frequency power source 150B to generate a plasma. In the step ST21, processing with a high aspect ratio is necessary, so that a power of 4000 [W] is applied at a frequency of, for example, 3 [MHz] by the second power source 22b.

<Step ST31>

In the step ST31, isotropic etching is necessary to etch the polysilicon regions L21. Specifically, in the step ST31, $NF_3$ gas, Ar gas, and $O_2$ gas are introduced into the processing container 12, the pressure is maintained, for example, at a high pressure of 400 [mT], and high-frequency power is applied thereto using the high-frequency power source 150A and the high-frequency power source 150B to generate a plasma. In the step ST31, in order to perform isotropic etching, a bias voltage is not applied, or a low bias voltage is applied. For example, in the step ST31, a voltage of 0 [V] and a power of 0 [W] are respectively applied by the first power source 22a and the second power source 22b to perform etching processing.

Example 2

Figure 11:
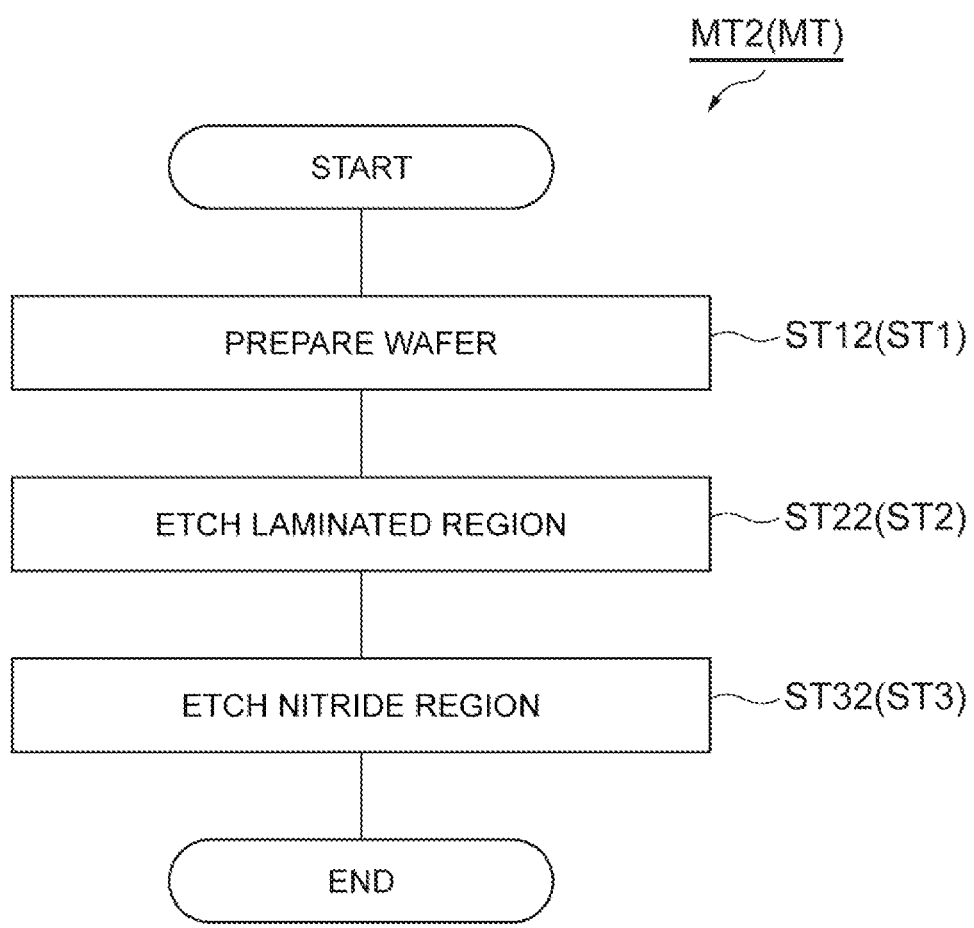
FIG. 11 is a flowchart showing an example of the method shown in FIG. 1.
Figure 12:
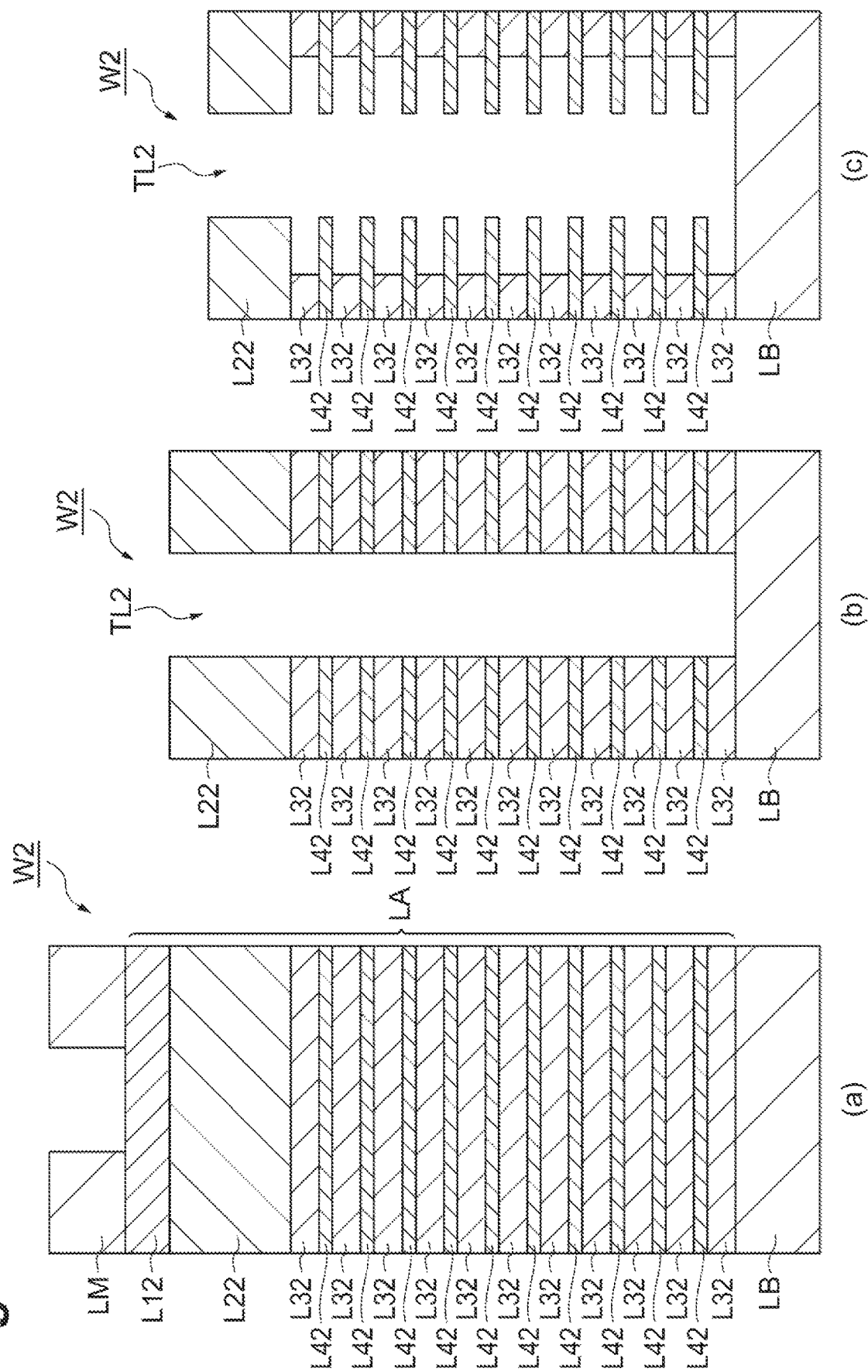
FIG. 12 includes parts (a) to (c), in which part (a) of FIG. 12 illustrates a sectional structure of a wafer before processing of the method shown in FIG. 11, and parts (b) and (c) of FIG. 12 illustrate sectional structures of the wafer after the processing of the method shown in FIG. 11.

The method MT described above can be applied to a case of etching a multilayer film of the wafer W2 illustrated in part (a) of FIG. 12. A method MT2 shown in FIG. 11 is an example of the above-described method MT and is used for processing the wafer W2. The wafer W2 (workpiece) illustrated in parts (a) to (c) of FIG. 12 is an example of the wafer W described above.

The wafer W2 illustrated in part (a) of FIG. 12 is a wafer used for manufacturing a 3D-NAND element. The wafer W2 includes a base body LB, a laminated region LA, and a mask LM. The laminated region LA includes a silicon oxynitride region L12, an amorphous carbon region L22, a plurality of nitride regions L32 (a plurality of first layers), and a plurality of oxide regions L42 (a plurality of second layers). In the laminated region LA, the silicon oxynitride region L12 is composed of only one layer. In the laminated region LA, the amorphous carbon region L22 is composed of only one layer. The material of the silicon oxynitride region L12 may be, for example, SiON. The material of the amorphous carbon region L22 is made of amorphous carbon. The nitride region L32 is a layer dominated by isotropic etching compared to the oxide region L42. The material of the nitride region L32 may be, for example, SiN. The material of the oxide region L42 may be, for example, $SiO_2$.

The laminated region LA is provided on the base body LB. The nitride regions L32 of the laminated region LA are disposed on the base body LB. In the laminated region LA, the nitride regions L32 and the oxide regions L42 are alternately laminated along the lamination direction. The mask LM is provided on the laminated region LA. In the laminated region LA, the amorphous carbon region L22 is disposed on the nitride region L32. In the laminated region LA, the silicon oxynitride region L12 is disposed on the amorphous carbon region L22. The mask LM is disposed on the silicon oxynitride region L12 of the laminated region LA.

The method MT2 shown in FIG. 11 includes a step ST12, a step ST22, and a step ST32. The step ST12 corresponds to the step ST1 shown in FIG. 1. The step ST22 corresponds to the step ST2 shown in FIG. 1. The step ST32 corresponds to the step ST3 shown in FIG. 1. First, in the step ST12 of the method MT2, the wafer W is prepared so that the wafer W2 illustrated in part (a) of FIG. 12, which is to be processed, is held by the holding structure 18 of the plasma processing apparatus 10.

In the step ST22 (first step) subsequent to the step ST12, as illustrated in part (b) of FIG. 12, in a state ($\phi=\phi1$) in which the first direction VL1 and the second direction VL2 are maintained at the first angle $\phi1$, the wafer W1 held by the holding structure 18 is etched by the plasma generated in the processing container 12. More specifically, in a state in which the first angle $\phi1$ is maintained in a range of −30 degrees to +30 degrees, which is suitable for anisotropic etching, the laminated region LA is etched in the lamination direction using the mask LM, and by this etching, a groove TL2 is formed in the laminated region LA.

In the step ST32 (second step) subsequent to the step ST22, as illustrated in part (c) of FIG. 12, in a state ($\phi=\phi2$) in which the first direction VL1 and the second direction VL2 are maintained at the second angle $\phi2$, the wafer W1 held by the holding structure 18 is etched by the plasma generated in the processing container 12. More specifically, in a state in which the second angle $\phi2$ is maintained in a range of −180 degrees to −150 degrees and +150 degrees to +180 degrees, which is suitable for isotropic etching, the nitride regions L32 exposed to the inside of the groove TL2 are etched. The absolute value of the first angle $\phi1$ is smaller than the absolute value of the second angle $\phi2$. Since the nitride region L32 is a layer dominated by isotropic etching compared to the oxide region L42, in the step ST32, among the nitride regions L32 and the oxide regions L42, only the nitride regions L32 can be selectively etched with a relatively high selectivity.

An example of process conditions of the steps ST22 and ST32 is shown.

<Step ST22>

In the step ST22, each region is processed to etch the laminated region LA in which a plurality of regions with different materials are laminated. In a case of etching the silicon oxynitride region L12, $CF_4$ gas, $CHF_3$ gas, and $O_2$ gas are introduced into the processing container 12, high-frequency power is applied thereto using the high-frequency power source 150A and the high-frequency power source 150B to generate a plasma. Furthermore, bias power is applied using the second power source 22b. In a case of etching the amorphous carbon region L22, $O_2$ gas and COS gas are introduced into the processing container 12, and high-frequency power is applied thereto using the high-frequency power source 150A and the high-frequency power source 150B to generate a plasma. Furthermore, bias power is applied using the second power source 22b. In a case of etching the nitride regions L32 and the oxide regions L42, under etching conditions for each of the nitride regions L32 and the oxide regions L42, $C_4F_6$ gas, $C_4F_8$ gas, $CH_2F_2$ gas, $CHF_3$ gas, Ar gas, and $O_2$ gas are introduced into the processing container 12, and under the etching conditions for each of the nitride regions L32 and the oxide regions L42, high-frequency power is applied thereto using the high-frequency power source 150A and the high-frequency power source 150B to generate a plasma. Furthermore, under the etching conditions for each of the nitride regions L32 and the oxide regions L42, bias power is applied using the second power source 22b. For etching of the nitride regions L32 and the oxide regions L42 in the step ST22, a cycle etching method is used. In addition, in the etching performed in the step ST22, processing with a high aspect ratio is necessary, so that a bias power of 5000 [W] is applied at a frequency of, for example, 3 [MHz] by the second power source 22b.

<Step ST32>

In the step ST32, isotropic etching is necessary to etch the nitride regions L32. Specifically, in the step ST32, $NF_3$ gas, Ar gas, and $O_2$ gas are introduced into the processing container 12, the pressure is maintained, for example, at a high pressure of 400 [mT], and high-frequency power is applied thereto using the high-frequency power source 150A and the high-frequency power source 150B to generate a plasma. In the step ST32, in order to perform isotropic etching, a bias voltage is not applied, or a low bias voltage is applied. For example, in the step ST32, a voltage of 0 [V] and a power of 0 [W] are respectively applied by the first power source 22a and the second power source 22b to perform etching processing.

Example 3

Figure 13:
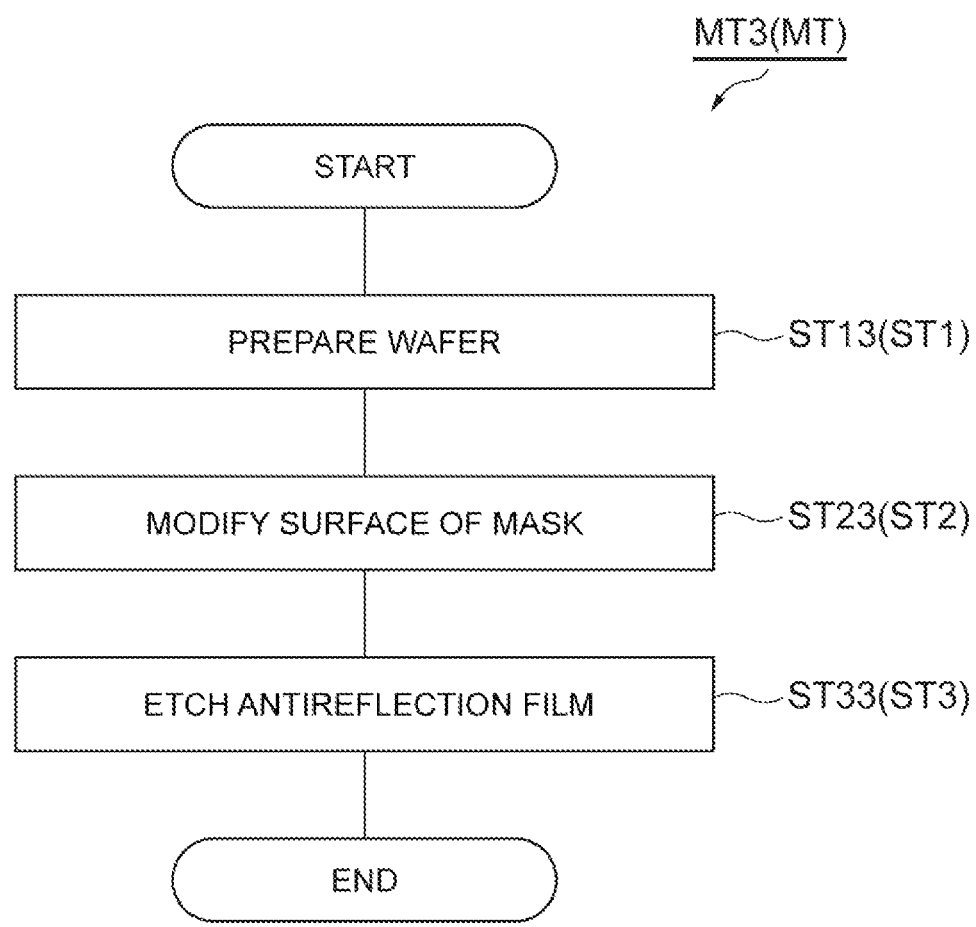
FIG. 13 is a flowchart showing an example of the method shown in FIG. 1.

The method MT described above can be applied to a case of etching a multilayer film of the wafer W3 illustrated in part (a) of FIG. 14. A method MT3 shown in FIG. 13 is an example of the above-described method MT and is used for processing the wafer W3. The wafer W3 (workpiece) illustrated in parts (a) to (c) of FIG. 14 is an example of the wafer W described above.

The wafer W3 includes a base body LB, a laminated region LA, and a mask LM. The laminated region LA includes an antireflection film L13, an organic film L23, and an etching target layer L33. The mask LM is a layer dominated by isotropic etching compared to the antireflection film L13. The material of the antireflection film L13 may include, for example, silicon oxide. The organic film L23 is, for example, a layer containing carbon or silicon and may be a SOH (spin-on hardmask) layer. The etching target layer L33 may be an insulating film made of silicon oxide ($SiO_2$).

The laminated region LA is provided on the base body LB. The etching target layer L33 of the laminated region LA is disposed on the base body LB. In the laminated region LA, the organic film L23 is disposed on the etching target layer L33. In the laminated region LA, the antireflection film L13 is disposed on the organic film L23. The mask LM is provided on the laminated region LA. The mask LM is arranged on the antireflection film L13 of the laminated region LA.

The method MT3 shown in FIG. 13 includes a step ST13, a step ST23, and a step ST33. The step ST13 corresponds to the step ST1 shown in FIG. 1. The step ST23 corresponds to the step ST2 shown in FIG. 1. The step ST33 corresponds to the step ST3 shown in FIG. 1. First, in the step ST13 of the method MT3, the wafer W is prepared so that the wafer W3 illustrated in part (a) of FIG. 14, which is to be processed, is held by the holding structure 18 of the plasma processing apparatus 10.

In the step ST23 (first step) subsequent to the step ST13, as illustrated in part (b) of FIG. 14, in a state ($\phi=\phi1$) in which the first direction VL1 and the second direction VL2 are maintained at the first angle $\phi1$, the wafer W1 held by the holding structure 18 is etched by the plasma generated in the processing container 12. More specifically, in a state in which the first angle $\phi1$ is maintained in a range of −180 degrees to −150 degrees and +150 degrees to +180 degrees, which is suitable for isotropic etching, the surface of the mask LM is modified. In the step ST23, since anisotropic etching is suppressed, etching of the mask LM is also suppressed. Therefore, deterioration of the mask length of the mask LM and the LWR (Line Width Roughness) and LER (Line Edge Roughness) of the mask LM from the state before execution of the step ST23 is suppressed.

In the step ST33 (second step) subsequent to the step ST23, as illustrated in part (c) of FIG. 14, in a state ($\phi=\phi2$) in which the first direction VL1 and the second direction VL2 are maintained at the second angle $\phi2$, the wafer W1 held by the holding structure 18 is etched by the plasma generated in the processing container 12. More specifically, in a state in which the second angle $\phi2$ is maintained in a range of −30 degrees to +30 degrees, which is suitable for anisotropic etching, using the mask LM, the antireflection film L13 is etched to form a mask LM13. The absolute value of the first angle $\phi1$ is larger than the absolute value of the second angle $\phi2$.

An example of process conditions of the steps ST23 and ST33 is shown.

<Step ST23>

In the step ST23, isotropic processing is necessary to modify the surface of the mask LM. $H_2$ gas and Ar gas are introduced into the processing container 12, the pressure is maintained at, for example, 5 [mT], and high-frequency power is applied thereto using the high-frequency power source 150A and the high-frequency power source 150B to generate a plasma. In the step ST23, in order to perform isotropic etching, a bias voltage is not applied, or a low bias voltage is applied. For example, in the step ST23, a voltage of 0 [V] and a power of 0 [W] are respectively applied by the first power source 22a and the second power source 22b to perform etching processing.

<Step ST33>

In the step ST33, anisotropic etching is necessary to etch the antireflection film L13. Specifically, in the step ST33, $CF_4$ gas and Ar gas are introduced into the processing container 12, the pressure is maintained at, for example, 5 [mT], and high-frequency power is applied thereto using the high-frequency power source 150A and the high-frequency power source 150B to generate a plasma. In addition, since anisotropic etching is required for the etching performed in the step ST33, a bias power of 500 [W] is applied at a frequency of, for example, 13 [MHz] by the second power source 22b.

In the method MT described above, in the step ST1 and the step ST2, since the direction of the holding structure 18 that holds the wafer W varies, in each step, the difference in ion density due to the plasma generated in the processing container 12 can be easily utilized without causing the complexity of processes. In particular, by changing the direction of the holding structure 18 in the processing container 12 without changing the gas state, the plasma state, and the like, the difference in ion density can be easily utilized.

In addition, in the step ST21 and the step ST31 of Example 1, since the direction of the holding structure 18 that holds the wafer W1 varies, the difference in ion density in the processing container 12 can be utilized. Therefore, by changing the direction of the holding structure 18, it is possible to easily switch between etching of the layer dominated by isotropic etching and etching of the layer dominated by anisotropic etching.

In addition, in the step ST22 and the step ST22 of Example 2, since the direction of the holding structure 18 that holds the wafer W2 varies, the difference in ion density in the processing container 12 can be utilized. Therefore, by changing the direction of the holding structure 18, it is possible to easily switch between etching of the layer dominated by isotropic etching and etching of the layer dominated by anisotropic etching.

In addition, in Example 3, in the step ST23 of modifying the surface of the mask LM dominated by isotropic etching, the absolute value of the first angle $\phi1$ is larger than the absolute value of the second angle $\phi2$. Therefore, the wafer W3 is avoided far away from the surface 194a of the dielectric plate 194, so that the ion density in the vicinity of the wafer W3 is decreased. Accordingly, deterioration of the shape of the mask LM due to the execution of the step ST23 can be avoided.

In addition, the difference in ion density due to the plasma generated in the processing container 12 can be sufficiently different between the case where the angle between the first direction VL1 and the second direction VL2 associated with the holding structure 18 is in a range of −30 degrees to +30 degrees and the case where the angle is in a range of −180 degrees to −150 degrees and +150 degrees to +180 degrees.

In addition, in a case of controlling ion energy, in the related art, the ion energy in the processing container 12 is controlled by controlling the ion current under the control of an applied voltage. However, even if the applied voltage is made zero, the ion energy does not reach zero, so that the lower limit of the ion energy becomes for example, about, 4.2 [eV] due to the influence of the presence of a plasma potential in the upper portion of the processing container 12. Accordingly, in order to reduce the ion energy below the lower limit, a member such as an ion trap plate is necessary. Contrary to this, as performed by the method MT according to the embodiment using the plasma processing apparatus 10, since the holding structure 18 can rotate 360 degrees (−180 degrees to +180 degrees) around the first axis AX1, by continuously rotating the surface FS of the wafer W held by the holding structure 18, it is possible to easily move the position of the surface FS to a position at which a suitable electron density is achieved. Therefore, the electron density in the vicinity of the surface FS of the wafer W can be easily set to a suitable value merely by rotating the holding structure 18 without controlling the ion current under the control of the applied voltage unlike the related art. In particular, even in a case where the ion energy reaches the lower limit, without using a member such as an ion trip plate, by causing the surface FS of the wafer W to be directed to the opposite side to the surface 194a of the dielectric plate 194 located on the ceiling side of the processing container 12 by rotating the holding structure 18 by, for example, about ±180 degrees (by moving the surface FS of the wafer W to a position farthest from the surface 194a), it is possible to reduce the ion energy in the vicinity of the surface FS below the lower limit. As described above, as performed by the method MT according to the embodiment using the plasma processing apparatus 10, by continuously rotating the holding structure 18 around the first axis AX1 in a range of −180 degrees to +180 degrees, the ion energy in the vicinity of the surface FS of the wafer W held by the holding structure 18 can be continuously controlled to reach a value (for example, rear 2 to 3 eV, and furthermore, near zero eV) lower than the lower limit in the related art. Since the ion energy can be easily set to the value lower than the lower limit, a high selectivity can be easily realized, for example, for etching of a Si film and a $SiO_2$ film by fluorine plasma.

While the principles of the present invention have been illustrated and described in the preferred embodiments, it should be understood by those skilled in the art that the present invention can be modified in arrangement and details without departing from such principles. The present invention is not limited to the specific configuration disclosed in the embodiment. Therefore, all modifications and changes coming within the scope of the claims and the spirit thereof are claimed.

REFERENCE SIGNS LIST

10 . . . plasma processing apparatus; 12 . . . processing container; 12a . . . intermediate part; 12e . . . exhaust port; 14 . . . gas supply system; 140 . . . high-frequency antenna; 142A . . . inner antenna element; 142B . . . outer antenna element; 144 . . . interposing body; 14a . . . gas supply portion; 14e . . . gas discharge hole; 150A . . . high-frequency power source; 150B . . . high-frequency power source; 16 . . . plasma source; 160 . . . shield member; 162A . . . inner shield wall; 162B . . . outer shield wall; 164A . . . inner shield plate; 164B . . . outer shield plate; 18 . . . holding structure; 194 . . . dielectric plate; 194a . . . surface; 20 . . . exhaust system; 20a . . . automatic pressure controller; 20b . . . turbomolecular pump; 20c . . . dry pump; 20d . . . valve; 20e . . . valve; 22 . . . bias power supply portion; 22a . . . first power source; 22b . . . second power source; 24 . . . driving device; 26 . . . rectifying member; 26a . . . upper portion; 26b . . . lower portion; 30 . . . holding portion; 32 . . . electrostatic chuck; 34 . . . lower electrode; 34a . . . first part; 34b . . . second part; 34f . . . coolant flow path; 35 . . . insulating member; 35a . . . first part; 35b . . . second part; 36 . . . rotating shaft portion; 36a . . . columnar portion; 36b . . . first tubular portion; 36c . . . second tubular portion; 36d . . . third tubular portion; 37 . . . first member; 38 . . . second member; 39a . . . sealing member; 39b . . . sealing member; 39c . . . sealing member; 40 . . . container portion; 42 . . . upper container portion; 44 . . . outer container portion; 50 . . . inclination shaft portion; 52 . . . magnetic fluid seal portion; 52a . . . inner ring portion; 52b . . . outer ring portion; 52c . . . magnetic fluid; 53 . . . bearing; 54 . . . rotary connector; 55 . . . bearing; 60 . . . wire; 62 . . . power source; 64 . . . wire; 66 . . . pipe; 68 . . . heat transfer gas source; 70 . . . rotary joint; 72 . . . pipe; 74 . . . pipe; 76 . . . chiller unit; 78 . . . rotary motor; 80 . . . pulley; 82 . . . transmission belt; AN . . . inclination angle; AX1 . . . first axis; AX2 . . . second axis; CE . . . center; Cnt . . . control unit; FA1 . . . horizontal reference plane; FA2 . . . vertical reference plane; FS . . . surface; L11 . . . nitride region; L12 . . . silicon oxynitride region; L13 . . . antireflection film; L21 . . . polysilicon region; L22 . . . amorphous carbon region; L23 . . . organic film; L31 . . . oxide region; L32 . . . nitride region; L33 . . . etching target layer; L42 . . . oxide region; LA . . . laminated region; LB . . . base body; LM . . . mask; LM13 . . . mask; MT . . . method; MT1 . . . method; MT2 . . . method; MT3 . . . method; OR . . . origin; PX . . . axis; S . . . space; TC . . . one period; TH . . . duration; TL . . . duration; TL1 . . . groove; TL2 . . . groove; VL1 . . . first direction; VL2 . . . second direction; W . . . wafer; W1 . . . wafer; W2 . . . wafer; W3 . . . wafer; XO . . . point of intersection.

The invention claimed is:

1. A method for etching a workpiece using a plasma processing apparatus, wherein
the plasma processing apparatus includes a holding structure which holds the workpiece, and a processing container which accommodates the holding structure,
the holding structure is rotatable by 360 degrees in the processing container around an inclination shaft provided in the processing container,
the inclination shaft intersects the holding structure,
an axis of the inclination shaft is parallel to a surface of an electrode plate of an upper electrode provided on a ceiling side of the processing container and a surface of the workpiece held by the holding structure,
in a state in which the surface of the workpiece held by the holding structure and the surface of the electrode plate are parallel to each other and face each other, a first center axis of the workpiece and a second center axis of the processing container overlap with each other and a first direction of the first center axis and a second direction of the second center axis are the same, the first center axis is perpendicular to the surface of the workpiece, the first direction is directed upward of the surface of the workpiece, the second center axis is perpendicular to the surface of the electrode plate, the second direction is directed toward the electrode plate provided on the ceiling side of the processing container from a bottom portion side of the processing container, the first center axis is inclined with respect to the second center axis as the holding structure rotates around the inclination shaft, the method comprises:
- a first step of generating a plasma in the processing container in which the workpiece is held by the holding structure, in a state in which the first direction and the second direction are maintained to form a first angle; and
- a second step of, after execution of the first step, generating a plasma in the processing container in which the workpiece is held by the holding structure, in a state in which the first direction and the second direction are maintained to form a second angle, the first angle and the second angle are −180 degrees to +180 degrees, an absolute value of the first angle and an absolute value of the second angle are different from each other the workpiece includes a laminated region and a mask provided on the laminated region, the laminated region includes a plurality of first layers and a plurality of second layers, the first layers and the second layers are alternately laminated along a lamination direction, the first layers and the second layers being made of different materials, the absolute value of the first angle is smaller than the absolute value of the second angle, in the first step, the laminated region is etched in the lamination direction using the mask, and, by the etching, a groove is formed in the laminated region, and in the second step, the first layers exposed to an inside of the groove are selectively etched.

2. The method according to claim 1, wherein of the first angle and the second angle, one angle having a smaller absolute value is an angle in a range of −30 degrees to +30 degrees, and the other angle of the first angle and the second angle is an angle in a range of −180 degrees to −150 degrees and +150 degrees to +180 degrees.

3. The method according to claim 1, wherein in cases where anisotropic etching is executed in the first step, the first angle is in a range of −30 degrees to +30 degrees, in cases where isotropic etching is executed in the first step, the first angle is in a range of −180 degrees to −150 degrees and +150 degrees to +180 degrees, in cases where anisotropic etching is executed in the second step, the second angle is in a range of −30 degrees to +30 degrees, and in cases where isotropic etching is executed in the second step, the second angle is in a range of −180 degrees to −150 degrees and +150 degrees to +180 degrees.

* * * * *